(12) United States Patent
Taniguchi

(10) Patent No.: US 6,819,203 B2
(45) Date of Patent: Nov. 16, 2004

(54) SURFACE ACOUSTIC WAVE FILTER DEVICE

(75) Inventor: Norio Taniguchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/043,140

(22) Filed: Jan. 14, 2002

(65) Prior Publication Data

US 2002/0180562 A1 Dec. 5, 2002

(30) Foreign Application Priority Data

Feb. 7, 2001 (JP) .................................. 2001-031444
Nov. 26, 2001 (JP) .................................. 2001-359544

(51) Int. Cl.[7] .............................. H03H 9/64; H03H 9/72
(52) U.S. Cl. ..................... 333/193; 333/133; 333/195
(58) Field of Search .......................... 333/193–196, 333/133; 310/313 R, 313 B, 313 C, 313 D

(56) References Cited

U.S. PATENT DOCUMENTS

| | | | | |
|---|---|---|---|---|
| 5,631,612 A | * | 5/1997 | Satoh et al. ............... | 333/193 |
| 5,909,156 A | * | 6/1999 | Nishihara et al. ......... | 333/193 |
| 5,914,646 A | * | 6/1999 | Hashimoto ................ | 333/195 |
| 5,999,069 A | * | 12/1999 | Ushiroku .................. | 333/193 |
| 6,137,380 A | * | 10/2000 | Ushiroku et al. .......... | 333/193 |
| 6,369,672 B1 | * | 4/2002 | Ikada ........................ | 333/193 |

FOREIGN PATENT DOCUMENTS

| | | |
|---|---|---|
| JP | 05-183380 | 7/1993 |
| JP | 06-069750 | 3/1994 |
| JP | 11-055067 | 2/1999 |

* cited by examiner

Primary Examiner—Barbara Summons
(74) Attorney, Agent, or Firm—Keating & Bennett, LLP

(57) ABSTRACT

A ladder circuit type SAW filter device includes series arm resonators and parallel arm resonators that are defined by SAW resonators. Among the parallel arm resonators, a first parallel arm resonator that is connected to one of an input end and an output end and a second parallel arm resonator that is connected to a junction between two series arm resonators have the relationship of $Cp1 \times 2 < Cp2$, where $Cp1$ represents the capacitance of the first parallel arm resonator and $Cp2$ represents the capacitance of the second parallel arm resonator. The inductance of an inductor that is connected to the second parallel arm resonator is equal to or less than the inductance of the inductor that is connected to the first parallel arm resonator. The SAW filter device has superior steepness of filter characteristics in the lower range of a pass band and outstanding attenuation in a stop band.

20 Claims, 23 Drawing Sheets

SURFACE ACOUSTIC WAVE FILTER DEVICE

BACKGROUND OF THE INVENTION

1. Field of the Invention

The present invention relates to surface acoustic wave (SAW) filter devices including a plurality of SAW elements, and in particular, to a SAW filter device in which a plurality of SAW resonators define parallel arm resonators and series arm resonators such that a ladder circuit is provided.

2. Description of the Related Art

Various types of SAW filters according to the prior art have been proposed in which a series arm SAW resonator is provided in a series arm between an input and an output of the SAW filter and a parallel arm SAW resonator is provided in a parallel arm between the series arm and the ground potential. SAW filters having a ladder circuit configuration have low loss and broad bandwidth. Accordingly, SAW filters are used as bandpass filters, and are widely used as cellular-phone bandpass filters.

According to Japanese Unexamined Patent Application Publication No. 5-183380, as shown in FIG. 29, the matching of a ladder type SAW filter is improved by connecting unit filters 501 and 502 as indicated by broken lines such that the configurations of the unit filters 501 and 502 are symmetrical. A unit filter is a circuit portion including a series arm resonator and a parallel arm resonator. In the SAW filter shown in FIG. 29, three unit filters 501 to 503 are connected. A combination of the resonators of the unit filters 501 and 502 is represented by the circuit diagram shown in FIG. 30.

In the circuit configuration shown in FIG. 30, series arm resonators S1 and S2 are connected between an input 504 and an output 505, and parallel arm resonators P1 and P2 are provided in two parallel arms. Where the capacitance of the parallel arm resonator P1 on the input side is represented by Cp1, and the capacitance of the parallel arm resonator P2 in the parallel arm located between the series arm resonators S1 and S2 is represented by Cp2, the ratio Cp2/Cp1=2 exists.

Japanese Unexamined Patent Application Publication No. 11-55067 discloses a structure in which the ratio Cp2/Cp1 is at least 2 and an inductor that is connected to an end of a parallel arm resonator P2 positioned between series arm resonators has a capacitance that is greater than that of an inductor connected to another parallel arm resonator. With this structure, attenuation in a frequency domain (frb to fra) lower than a pass band is achieved, as shown in FIG. 31.

It is common knowledge that, in a ladder SAW filter according to the prior art which includes a plurality of series arm resonators and a plurality of parallel arm resonators, the capacitances Cp1 and Cp2 of the parallel arm resonators may be set such that the ratio Cp2/Cp1=2 is obtained where impedance matching is important, and to ensure attenuation in a range lower than a pass band the ratio Cp2/Cp1 may be set to at least 1:2, and an inductor is connected to an end of a parallel arm resonator in a parallel arm located between the series arm resonators having a capacitance larger than that of an inductor connected to another parallel arm resonator.

A case in which the ratio Cp2/Cp1=2 as described in Japanese Unexamined Patent Application Publication No. 5-183380 has a problem in that the steepness of filter characteristics in a range lower than in the pass band deteriorates. The steepness of the filter characteristics in the lower range is indicated by a frequency distance Δf between attenuation values A to B in FIG. 32. The smaller the frequency distance Δf, the higher the selectivity.

As is disclosed in Japanese Unexamined Patent Application Publication No. 11-55067, where the ratio Cp2/Cp1 is at least 2 and an inductor that is connected to an end of a parallel arm resonator provided between series arm resonators has an inductance that is greater than that of an inductor connected to another parallel arm resonator, attenuation is enhanced in a range lower range than the pass band, as described above. Also, the steepness of the filter characteristics in the lower range of the pass band is enhanced, although this feature is not clearly described in Japanese Unexamined Patent Application Publication No. 11-55067.

However, it is found that the structure disclosed in Japanese Unexamined Patent Application Publication No. 11-55067 causes deterioration in attenuation in a range higher than the pass band.

SUMMARY OF THE INVENTION

To overcome the above-described problems, preferred embodiments of the present invention provide a ladder circuit type SAW filter device that has sufficient attenuation in each stop band of ranges higher and lower than a pass band and has superior steepness of filter characteristics in a low frequency domain in the vicinity of the pass band, and a communication apparatus including such a novel SAW filter.

According to a preferred embodiment of the present invention, a ladder circuit type surface acoustic wave filter device includes a piezoelectric substrate, a plurality of parallel arm resonators and a plurality of series arm resonators provided on the piezoelectric substrate which are respectively defined by surface acoustic wave resonators, and a plurality of inductors connected in series to the parallel arm resonators. The parallel arm resonators include a first parallel arm resonator connected to one of an input end and an output end, and a second parallel arm resonator connected to a junction between two series arm resonators. The first parallel arm resonator and the second parallel arm resonator have a relationship represented by the following expression:

$$Cp1 \times 2 < Cp2$$

where Cp1 represents the capacitance of the first parallel arm resonator, Cp2 represents the capacitance of the second parallel arm resonator. The inductor connected to the second parallel arm resonator has an inductance that is substantially equal to or less than the inductance of the inductor connected to the first parallel arm resonator.

Preferably, the capacitance Cp2 of the second parallel arm resonator is in a range represented by the following expression:

$$Cp1 \times 2 < Cp2 < Cp1 \times 10.$$

The resonance frequency of the second parallel arm resonator may be lower than the resonance frequency of the first parallel arm resonator.

The ladder circuit type surface acoustic wave filter device according to another preferred embodiment of the present invention further includes a package which contains surface acoustic wave elements in which the parallel arm resonators and the series arm resonators are provided on the piezoelectric substrate and a plurality of electrode pads connected to the series arm resonators or the parallel arm resonators, and bonding wires to connect the electrode pads to the series arm resonators or the parallel arm resonators. The length of the bonding wire connected to the second parallel arm resonator is substantially equal to or less than the length of the bonding wire connected to the first parallel arm resonator such that the inductor connected to the second parallel arm resonator has an inductance that is substantially equal to or less than the inductance of the inductor connected to the first parallel arm resonator.

The ladder circuit type surface acoustic wave filter device according to another preferred embodiment further includes a package which contains surface acoustic wave elements in which the parallel arm resonators and the series arm resonators are provided on the piezoelectric substrate and a plurality of electrode pads connected to the series arm resonators or the parallel arm resonators, and bonding wires to connect the electrode pads to the series arm resonators or the parallel arm resonators. One end of the second parallel arm resonator is electrically connected to at least two electrode pads among the electrode pads which are connected to the ground potential such that the inductor which is connected to the second parallel arm resonator has an inductance that is substantially equal to or less than the inductance of the inductor connected to the first parallel arm resonator.

According to another preferred embodiment of the present invention, a communication apparatus includes at least one ladder circuit type surface acoustic wave filter device in accordance with other preferred embodiments of the present invention, wherein the at least one ladder circuit type surface acoustic wave filter defines a bandpass filter of the communication apparatus.

According to various preferred embodiments of the present invention, in a ladder circuit type surface acoustic wave filter device including a piezoelectric substrate, a plurality of parallel arm resonators and a plurality of series arm resonators which are provided on the piezoelectric substrate and which are respectively defined by surface acoustic wave resonators, and a plurality of inductors which are respectively connected in series to the parallel arm resonators, the parallel arm resonators include a first parallel arm resonator connected to one of an input end and an output end, and a second parallel arm resonator connected to a junction between two series arm resonators. The first parallel arm resonator and the second parallel arm resonator have the relationship Cp1×2<Cp2, that is, the capacitance ratio Cp2/Cp1 is greater than 2, where Cp1 represents the capacitance of the first parallel arm resonator, Cp2 represents the capacitance of the second parallel arm resonator. Thus, the steepness of the filter characteristics in the lower range of a pass band is greatly improved. Because the inductor which is connected to the second parallel arm resonator has an inductance that is substantially equal to or less than the inductance of the inductor connected to the first parallel arm resonator, a sufficient amount of attenuation outside of the pass band is produced. Therefore, outstanding filter characteristics that not only have superior steepness but also have sufficient attenuation in a stop band are obtained.

In particular, when Cp1×2<Cp2<Cp1×10, not only the steepness of the filter characteristics and the attenuation in the stop band are improved, but also sufficient bandwidth is achieved.

When the resonance frequency of the second parallel arm resonator is lower than the resonance frequency of the first parallel arm resonator, reflection characteristics in the lower range of the pass band do not deteriorate. This effectively enhances the steepness of filter characteristics.

In the present invention, members defining the inductors connected in series to the parallel arm resonators are not particularly limited. By controlling the length of the bonding wire connecting each electrode pad in the package and each parallel arm resonator, the inductance of the inductor connected to the parallel arm resonator is controlled. Specifically, the length of the bonding wire connected to the second parallel arm resonator is substantially equal to or less than the length of the bonding wire connected to the first parallel arm resonator, wherein the inductor connected to the second parallel arm resonator has an inductance that is substantially equal to or less than the inductance of the inductor connected to the first parallel arm resonator. Similarly, by electrically connecting one end of the second parallel arm resonator to the electrode pads via the bonding wires, the inductor connected to the second parallel arm resonator has an inductance that is substantially equal to or less than the inductance of the inductor connected to the first parallel arm resonator.

In a communication apparatus of a preferred embodiment of the present invention, the SAW filter device of other preferred embodiments of the present invention is preferably used as a bandpass filter. Accordingly, filter characteristics in the bandpass filter are greatly improved, such that a communication apparatus having superior selectivity is provided.

Other features, elements, characteristics and advantages of the present invention will become more apparent from the detailed description of preferred embodiments below with reference to the attached drawings.

DETAILED DESCRIPTION OF PREFERRED EMBODIMENTS

The present invention eliminates the problem in the SAW filter disclosed in Japanese Unexamined Patent Application Publication No. 11-55067. The present inventors have discovered that, although attenuation in a frequency range that is lower than a pass band is improved by using the construction described in Background of the Invention, attenuation in a frequency range higher than the pass band conversely decreases.

The attenuation of a ladder SAW filter is determined by the ratio of the capacitance Cs of a series arm resonator to the capacitance Cp of a parallel arm resonator when the parallel arm resonator does not include an inductance component. In general, when a SAW filter is formed, in many cases, an electrode land of a package is electrically connected to a terminal of a SAW filter element via a bonding wire. The bonding wire operates as an inductance component, such that the inductance component is connected to the parallel arm resonator. Additionally, a lead electrode in the package defines an inductance component. Accordingly, the inductance components connected in series to the parallel arm resonator greatly influence attenuation outside of the pass band.

In a frequency range lower than the pass band, the influence of the inductance components is minimal. Conversely, in a frequency range higher than the pass band, the influence of the inductance components is large.

Figure 2:
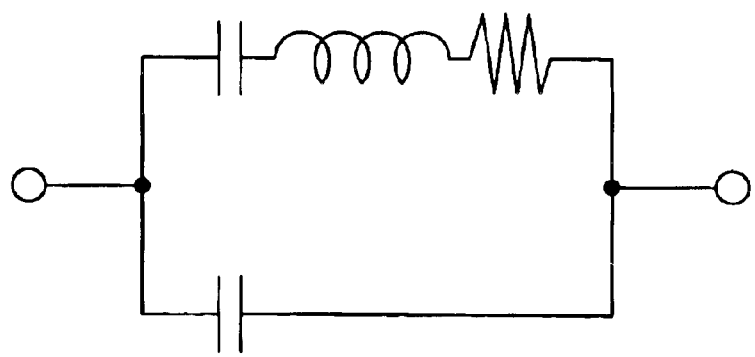
FIG. 2 is a circuit diagram showing an equivalent circuit of a general SAW resonator.
Figure 3:
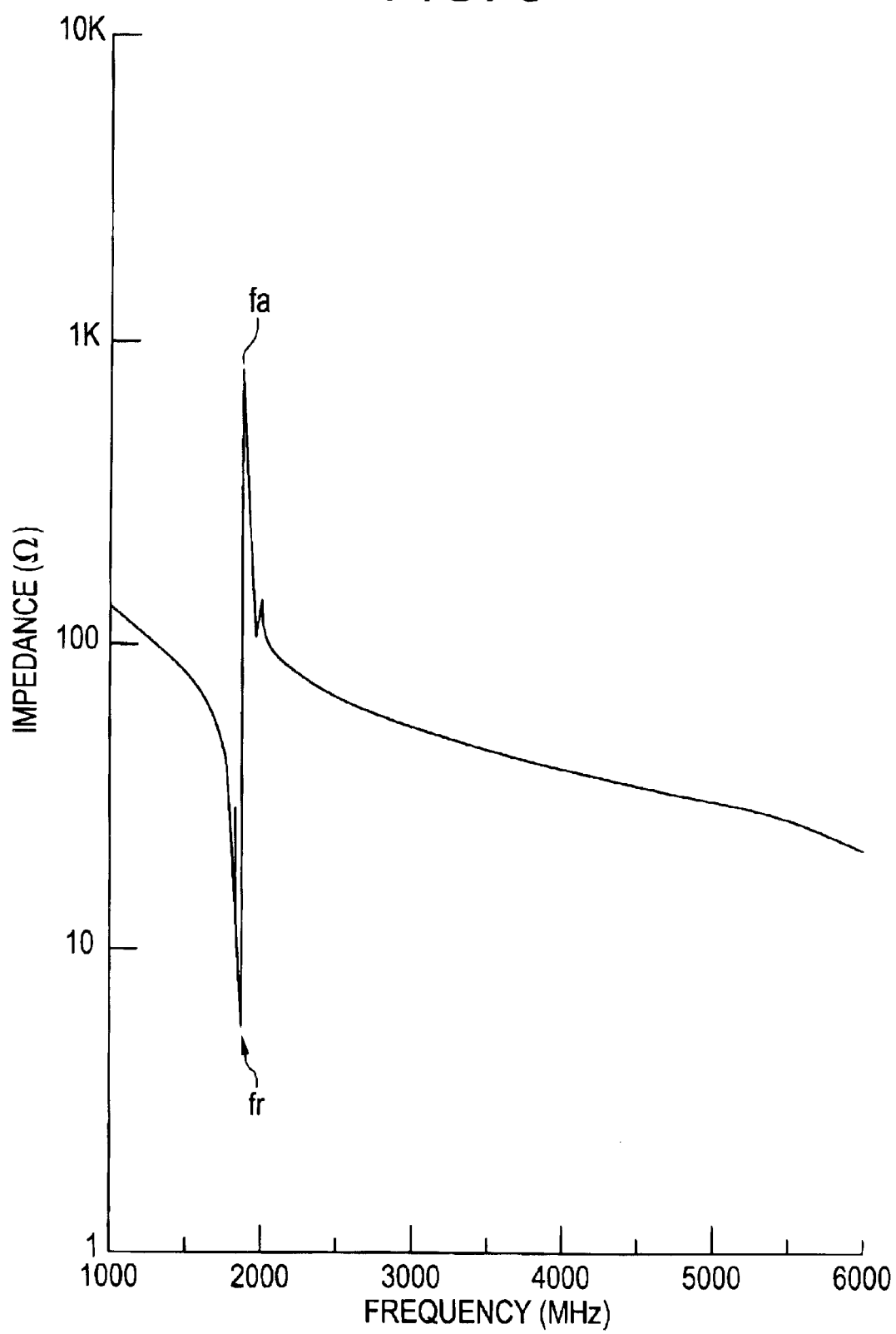
FIG. 3 is a graph showing the impedance characteristics of the SAW resonator shown in FIG. 2.
Figure 4:
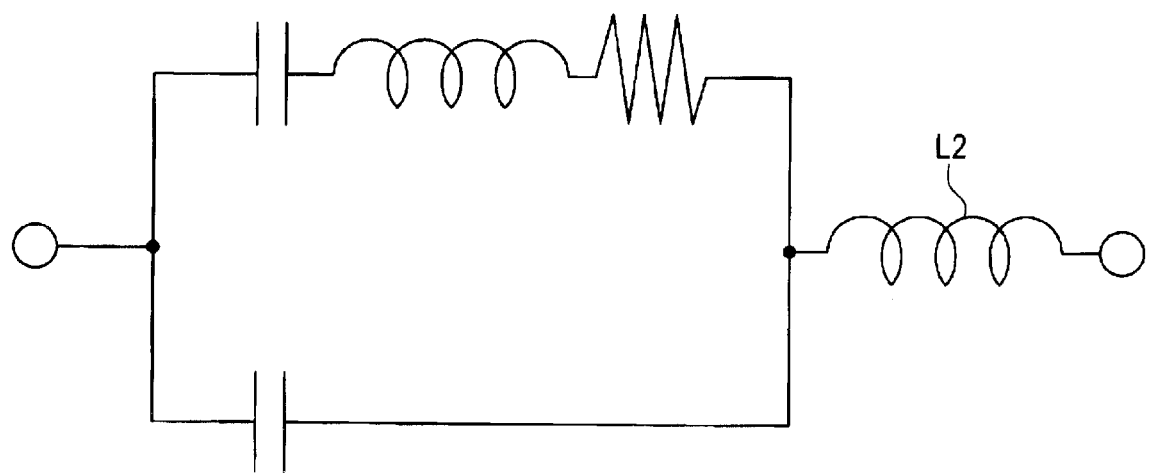
FIG. 4 is a circuit diagram showing an equivalent circuit in which an inductor is connected in series to a SAW resonator.
Figure 5:
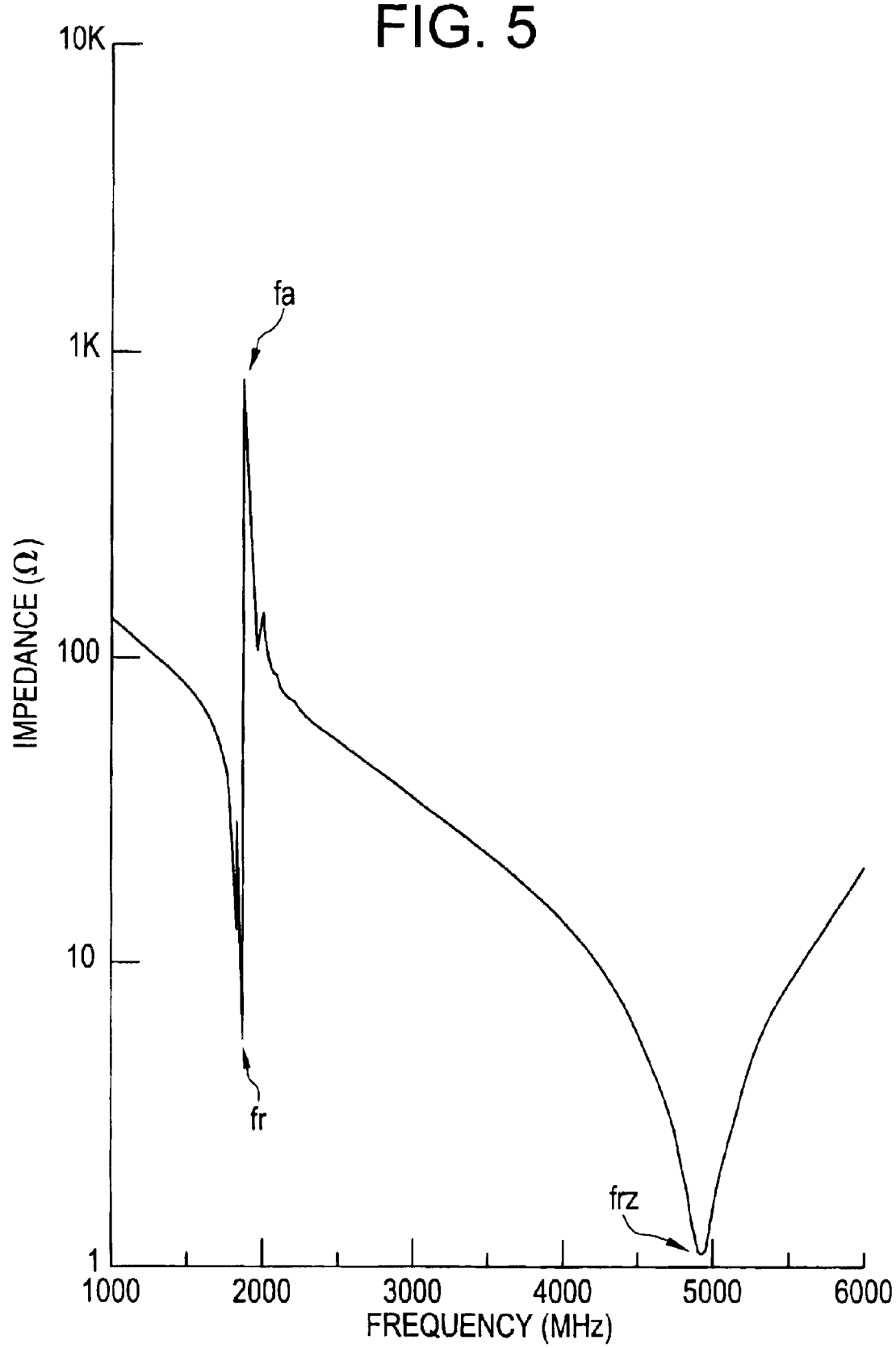
FIG. 5 is a graph showing the impedance characteristics of the equivalent circuit shown in FIG. 4.

FIG. 2 shows an equivalent circuit of a single port SAW resonator, and FIG. 3 shows the impedance characteristics of the single port SAW filter. FIG. 4 show an equivalent circuit in which an inductor L2 is connected in series to a SAW filter, and FIG. 5 shows the impedance characteristics of the equivalent circuit.

As FIG. 3 shows, the impedance characteristics of the single port SAW filter have a resonant point fr and an anti-resonant point fa. Nevertheless, as FIG. 5 shows, a second resonant point is generated at a frequency higher than a frequency at which the anti-resonant point fa is generated when the inductor L2 is connected to the SAW filter, as shown in FIG. 4. When the frequency of the second resonant point fr2 is sufficiently higher than that for the anti-resonant point fa, the frequency of the second resonant point fr2 is determined by the following expression:

$$fr2 \approx (L2 \times C0)^{-0.5}/(2 \times \pi) \tag{1}$$

Thus, the frequency of the second resonant point fr2 is dependent on an electrode capacitance C0 and the inductance of the inductor L2, such that the greater the electrode capacitance C0 and the inductance of the inductor L2, the lower the frequency of the second resonant point fr2. When the second resonant point fr2 is closer to the anti-resonant point fa, the precision of the frequency of the second resonant point fr2 deteriorates. However, there is a tendency for the frequency of the second resonant point fr2 to decrease as the capacitance C0 and the inductance of the inductor L2 increases.

When the characteristics of a broad frequency range of a ladder SAW filter in which a SAW resonator is used is observed, the second resonant point fr2 of the SAW resonator acts as an attenuation pole, and at the frequency of the attenuation pole, attenuation is improved. However, in a frequency range higher than the second resonant point fr2, the equivalent circuit in FIG. 4 acts as a high-pass filter because the entire equivalent circuit operates as an inductor, such that attenuation deteriorates in the frequency range higher than the second resonant point fr2.

Figure 6:
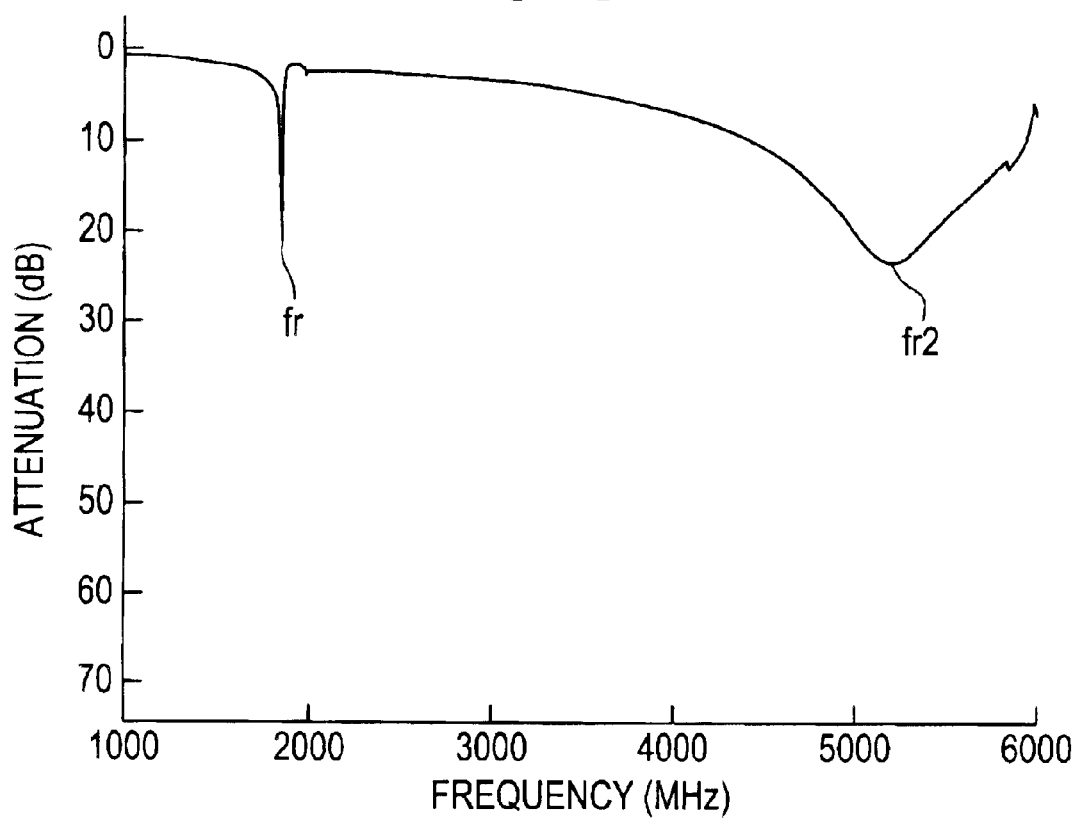
FIG. 6 is a graph showing transmission characteristics in a circuit configuration in which an inductor is connected in series to a parallel arm resonator.
Figure 7:
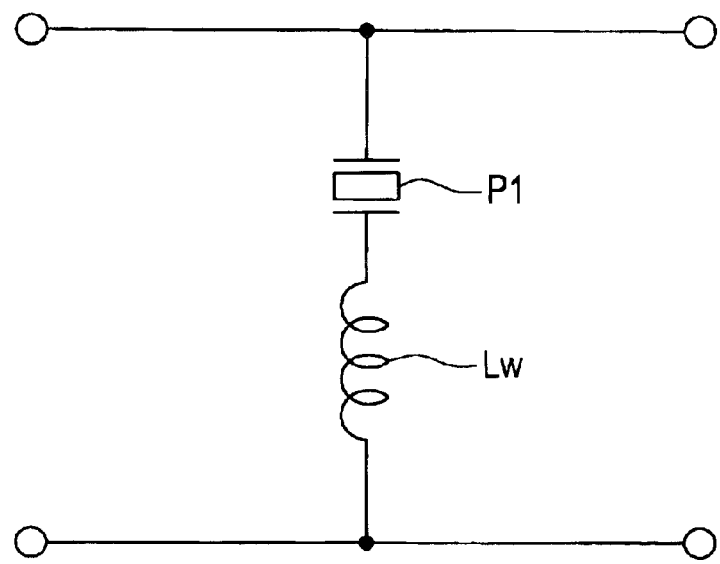
FIG. 7 is a circuit diagram showing a circuit configuration having the transmission characteristics shown in FIG. 6.

For a more specific description, FIG. 6 shows transmission characteristics obtained by connecting, in parallel, elements each having an inductor connected in series to a SAW resonator. A circuit configuration from which the transmission characteristics are obtained is shown in FIG. 7. An interdigital transducer provided on a 36-degree $LiTiO_3$ substrate such that the interdigital transducer has a crossing width of 50 μm, 40 pairs of electrode fingers, an electrode-finger pitch of 1.05 μm, and h/γ=0.09 is used as a SAW resonator P1. The inductance of an inductor Lw is about 1 nH.

FIG. 6 illustrates that the circuit configuration generates attenuation poles at a resonant point fr and a second resonant point fr2 and attenuation deteriorates at a frequencies higher than the frequency of the second resonant point fr2.

Figure 8:
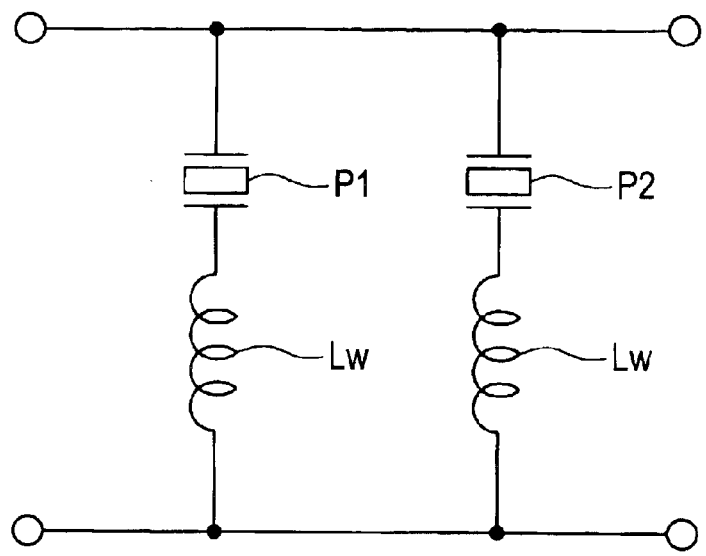
FIG. 8 is a circuit diagram showing a circuit in which two parallel arm resonators are connected in cascade and inductors are connected in series to the parallel arm resonators.
Figure 9:
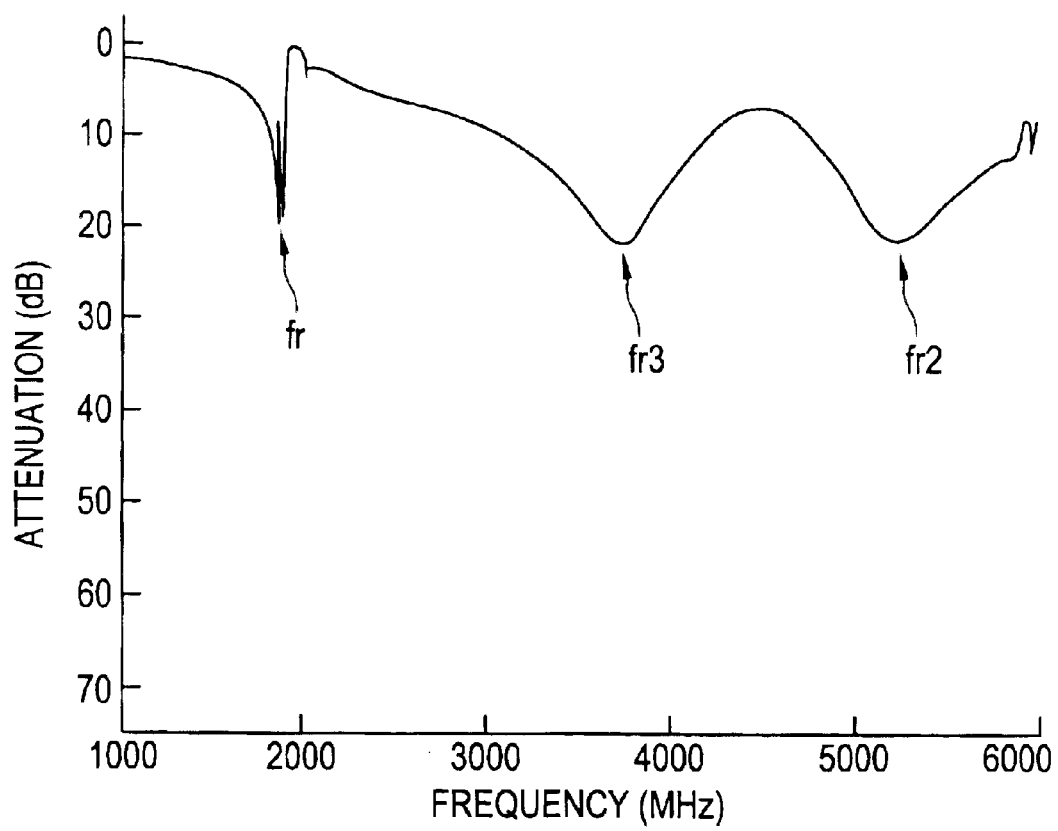
FIG. 9 is a graph showing the transmission characteristics of the circuit shown in FIG. 8.

In addition, as FIG. 8 shows, two parallel arms are provided, and inductors Lw are connected to parallel arm resonators P1 and P2. FIG. 9 shows transmission characteristics obtained when a ratio in capacitance of the parallel arm resonator P1 to P2 is 1:2 in the circuit in FIG. 8.

In the circuit in FIG. 8 from which the transmission characteristics in FIG. 9 are obtained, the parallel arm resonator P1 is identical to parallel arm resonator used to obtain the characteristics in FIG. 6, and the parallel arm resonator P2 is identical to the parallel arm resonator P1 except the crossing width is about 100 μm.

As is clear from FIG. 9, an attenuation pole caused by a second resonant point fr2 of the parallel arm resonator P1 is generated at the frequency of the second resonant point fr2, and an attenuation pole caused by a second resonant point fr3 of the parallel arm resonator P1 is generated at the frequency of the second resonant point fr3. It is found that these frequencies of the resonant points fr2 and fr3 differ. Accordingly, in the transmission characteristics in FIG. 9, attenuation is improved as a whole compared with the transmission characteristics in FIG. 6.

Nevertheless, it is found that, when a frequency difference between the two attenuation poles is too large, attenuation between the poles deteriorates substantially.

Figure 10:
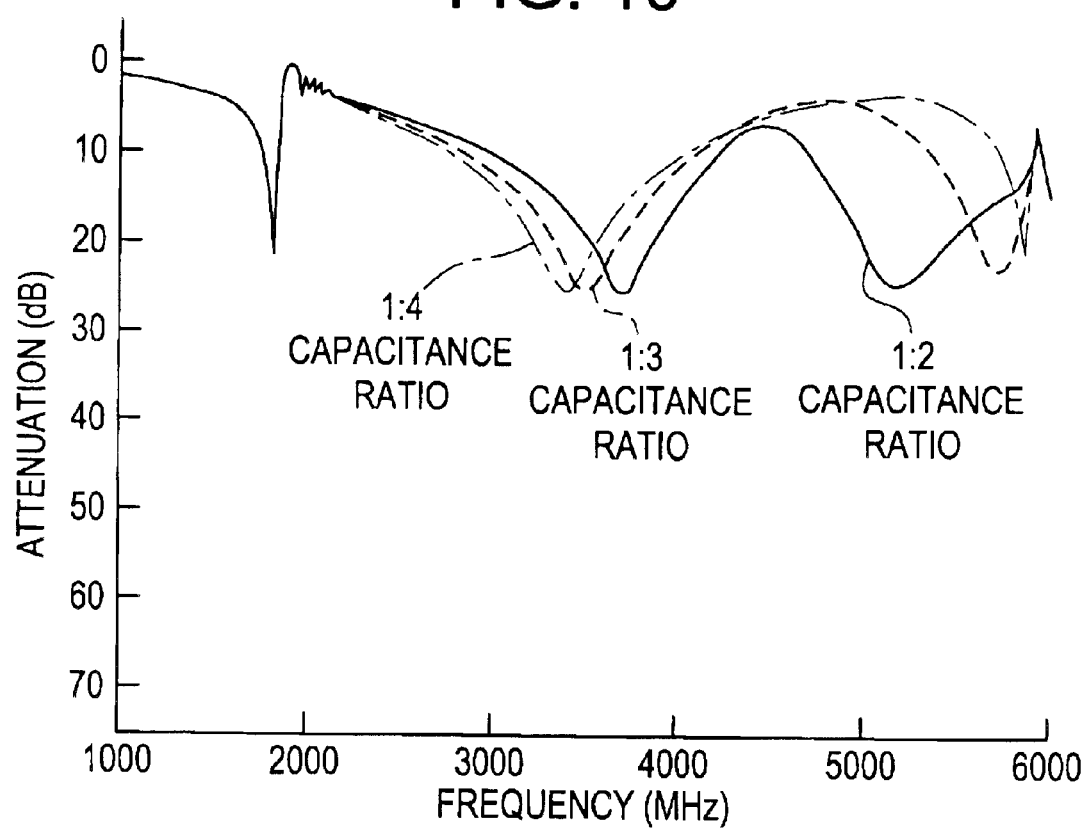
FIG. 10 is a graph showing changes in transmission characteristics obtained when a ratio of the capacitance of a parallel arm resonator P1 to the capacitance of a parallel arm resonator P2 is changed in the circuit configuration shown in FIG. 8.

Specifically, transmission characteristics that are obtained when the capacitance ratio of the parallel arm resonator P1 to P2 is changed to approximately 1:2, 1:3, and 1:4 are shown in FIG. 10. Electrode parameters in this case are shown in the following table, in which the capacitance ratio is changed such that the sum of the capacitances of the parallel arm resonators P1 and P2 remains unchanged. This is accomplished by setting the capacitance of the parallel arm resonator P1 to be smaller and the capacitance of the parallel arm resonator P2 to be larger.

TABLE 1

| P1:P2 | No. of Pairs | | Crossing Width | | Electrode Pitch | |
|---|---|---|---|---|---|---|
| | P1 | P2 | P1 | P2 | P1 | P2 |
| 1:2 | 40 (pairs) | 40 (pairs) | 50 μm | 100 μm | 1.05 μm | 1.05 μm |
| 1:3 | 40 (pairs) | 40 (pairs) | 37.5 μm | 112.5 μm | 1.05 μm | 1.05 μm |
| 1:4 | 40 (pairs) | 40 (pairs) | 30 μm | 120 μm | 1.05 μm | 1.05 μm |

As illustrated in FIG. 10, the greater the capacitance ratio, the worse the attenuation between two attenuation poles becomes. As represented by expression (1), even if inductances are equal, the resonance frequency decreases as the electrode capacitance increases, and the resonance frequency increases as the electrode capacitance decreases. Accordingly, the attenuation between two attenuation poles deteriorates, as shown in FIG. 10, because the distance between two attenuation poles is increased by changing the capacitance ratio from about 1:2 to about 1:4.

In the prior art described in Japanese Unexamined Patent Application Publication No. 11-55067, the inductance of an inductance component connected to a parallel arm resonator P2 having a large capacitance is relatively large. Thus, the inductance component increases the frequency distance between two attenuation poles, and thus, the attenuation deteriorates.

Conversely, according to preferred embodiments of the present invention, the steepness of the filter characteristics in the vicinity of a lower range of the pass band is greatly enhanced and attenuation in the higher range of the pass band is greatly improved. This point fr2 is described below.
1. Improvement in Steepness in Lower Range of Pass Band To improve the steepness of the filter characteristics in the lower range of the pass band, in preferred embodiments of the present invention, both the capacitance Cp1 of a first parallel arm resonator connected to an input end or an output end and the capacitance Cp2 of a second parallel arm resonator connected to a junction of two serial arm resonators are such that Cp1×2<Cp2 is satisfied, as described above.

Figure 29:
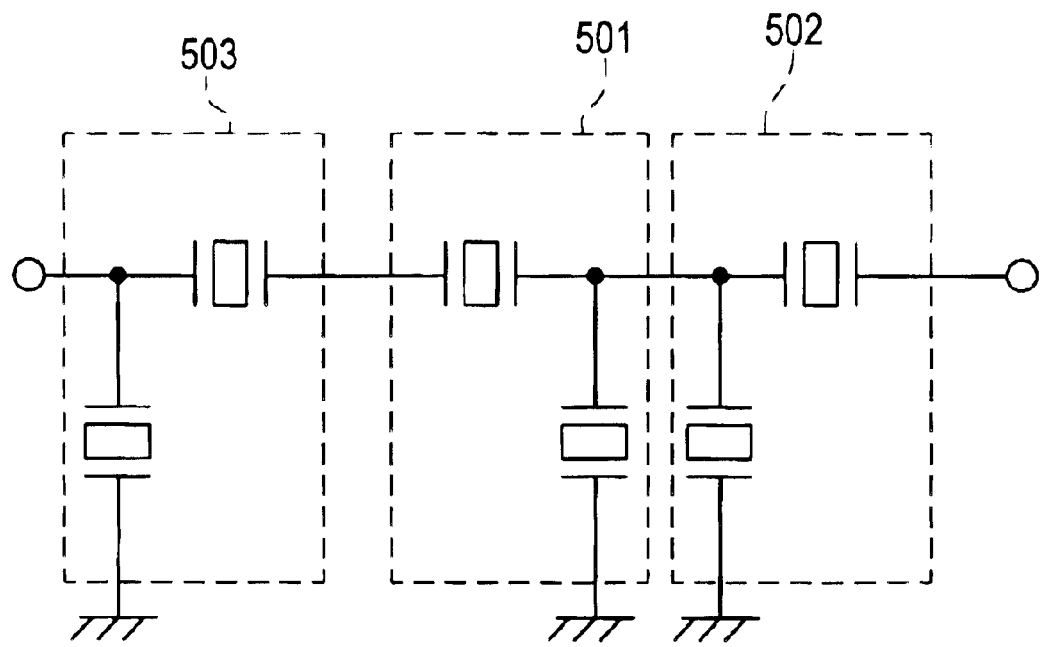
FIG. 29 is a circuit diagram showing a circuit configuration of a SAW filter device according to the prior art.
Figure 30:
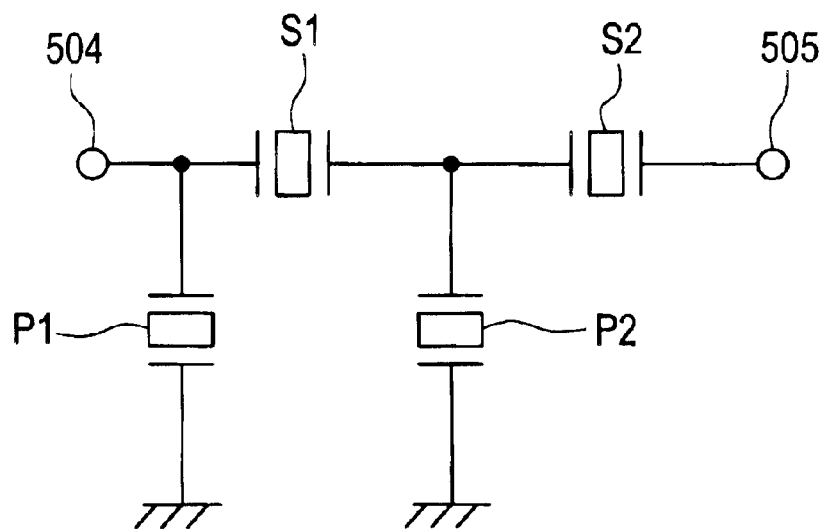
FIG. 30 is a circuit diagram showing another circuit configuration of the SAW filter device according to the prior art.

Optimization of electrode capacitance where ladder SAW filters are connected in a plurality of stages is described in Japanese Unexamined Patent Application Publication No. 5-183380. As described, with reference to FIGS. 29 and 30, impedance matching is regarded as important, and a connection structure in which symmetrical configurations are provided is used. Accordingly, when a parallel arm resonator disposed closest to either an input end or an output end, that is, a parallel arm resonator corresponding to the first arm resonator in preferred embodiments of the present invention has a capacitance Cp1, and a parallel arm resonator connected to a junction between series arm resonators, that is, the second parallel arm resonator in preferred embodiments of the present invention has a capacitance Cp2, the relationship Cp2/Cp1=2 is maintained.

It is common knowledge that the attenuation of the entire ladder SAW filter is determined by a ratio of the capacitance Cp of a parallel arm resonator to the capacitance Cs of a series arm resonator. The attenuation is increased in proportion to the ratio Cp/Cs. Actually, the attenuation outside of the pass band is greatly influenced by the inductance component when a bonding wire is used. Since a resonant point caused by the added inductance component is generated at a frequency higher than the anti-resonance frequency, the influence of Cp/Cs in the lower range of the pass band is still dominant.

If the central frequency f0 the pass band and an input/output impedance Z0 have been determined, the use of the following expression to determine the optimal product of the capacitances of the series arm resonator and the parallel arm resonator is known when the parasitic component of the package is not considered (Japanese Unexamined Patent Application Publication No. 6-69750). As a result, when Cp2/Cp1=2, the absolute value of the capacitance has a small degree of freedom. However, it should be noted that, even when the parasitic component of the package is considered, the absolute value of capacitance still has a relatively small degree of freedom.

$$Z0^2 = 1/(\omega 0^2 \times Cs \times Cp) \qquad (2)$$

where ω0 represents an angular frequency to the central frequency f0 of the pass band.

In other words, to produce a certain amount of attenuation, first, the capacitance ratio Cp/Cs is determined, and the capacitance product Cp by Cs is determined by the input/output impedance and the central frequency f0 of the filter. If a symmetrically configured connection structure is used, the capacitance of each parallel arm resonator can also be determined. Accordingly, the absolute value of the capacitance of each parallel arm resonator has an extremely low degree of freedom.

In addition, as the distance Δf between the resonance frequency and the anti-resonance frequency of the parallel arm resonator decreases, the steepness in the lower range of the ladder SAW filter is enhanced. Also, where an inductor is connected in series to a SAW resonator, the resonance frequency decreases and the distance Δf increases. As the inductance component and the electrode capacitance increases, the distance Δf increases. Thus, when the steepness of the filter characteristics is increased, it is preferable to reduce the inductance component or that the electrode capacitance.

Although the magnitude of the inductance component can be, to some extent, reduced by improving the length of the bonding wire and connection structure, it is difficult to reduce the magnitude below a predetermined magnitude. Thus, to increase the steepness of the filter characteristics in the vicinity of the pass band, it is preferable to reduce the capacitance of the parallel arm resonator.

However, in the structure according to the prior art in which a connection structure having symmetrical configurations is used, the capacitance of the parallel arm resonator is independently determined. Accordingly, an inverse relationship exists between improvement of the attenuation outside of the pass band and improvement of the steepness of the filter characteristics, such that it is very difficult to increase the attenuation outside of the pass band and the improve the steepness of filter characteristics.

The influence of each parallel arm resonator where ladder SAW filters are connected in a plurality of stages is described below.

Figure 31:
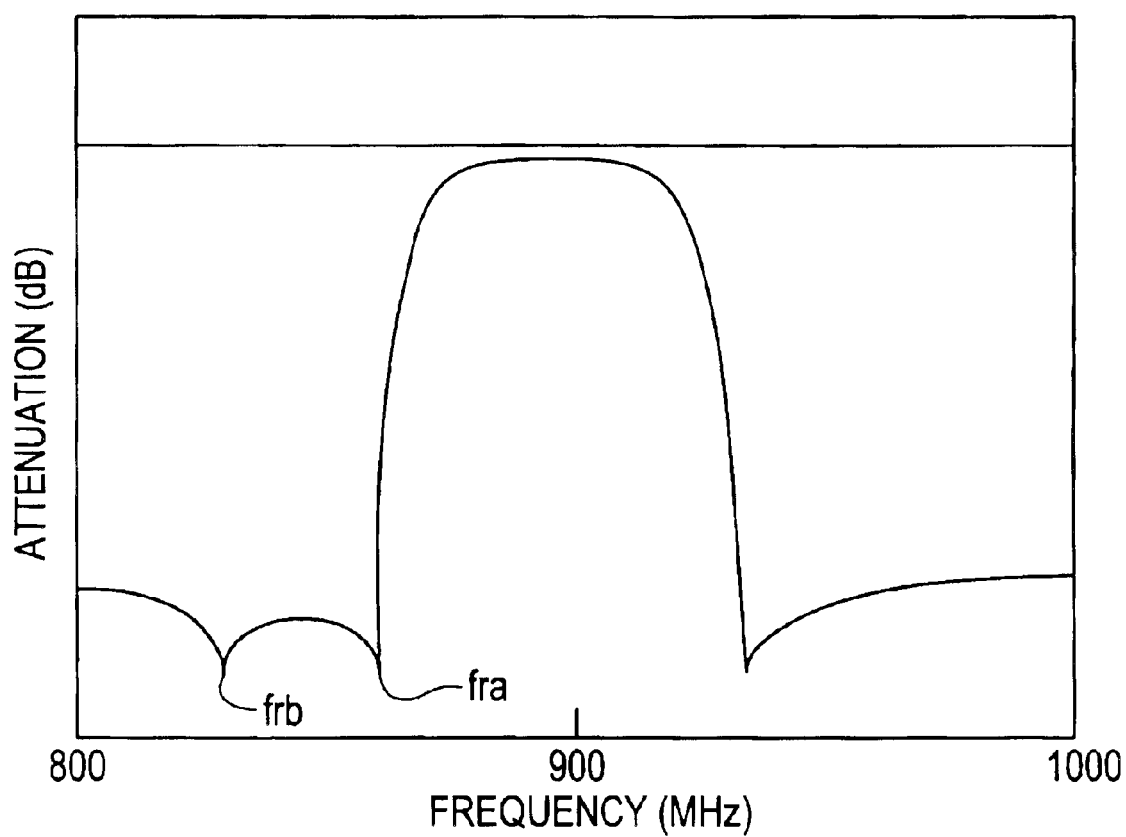
FIG. 31 is a graph showing the transmission characteristics of the SAW filter device shown in FIG. 30.
Figure 32:
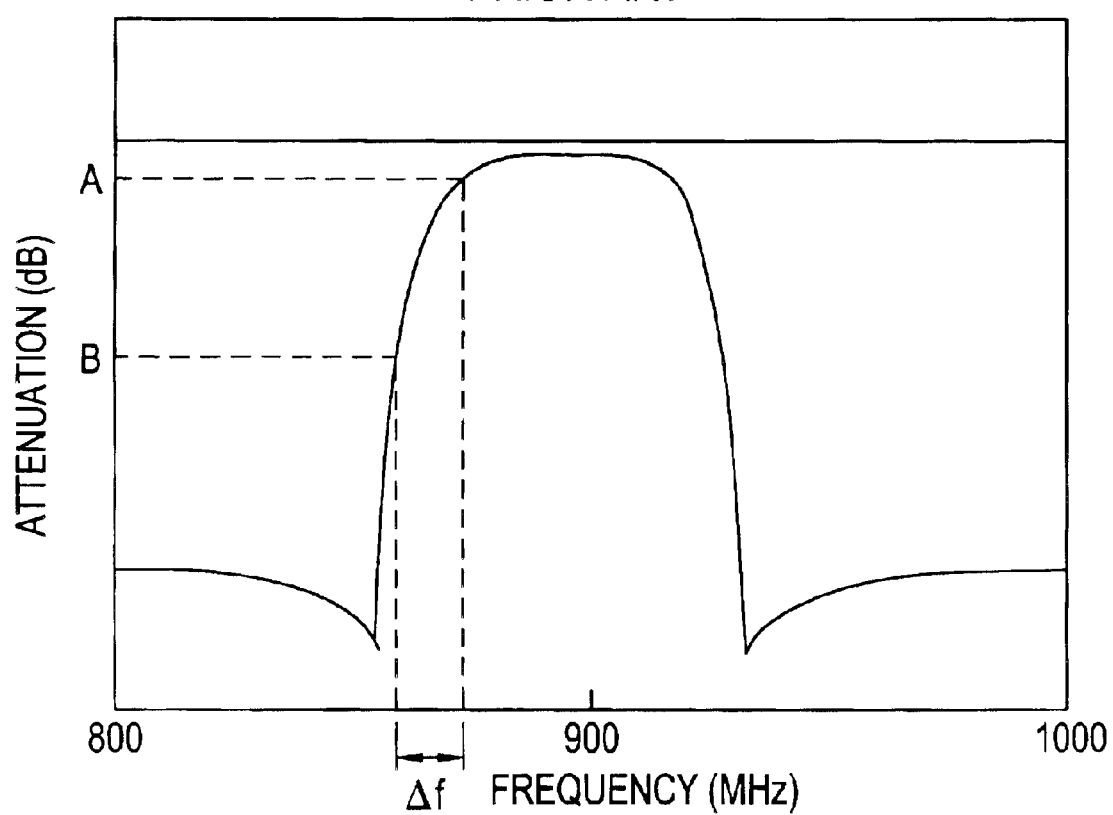
FIG. 32 is a graph showing the steepness of filter characteristics in the frequency characteristics of a SAW filter device according to the prior art.

When a plurality of attenuation poles are generated by a plurality of parallel arm resonators, the steepness in the lower range of the filter characteristics is determined by the position of the closest attenuation pole to the pass band in its lower range. For example, in the filter characteristics shown in FIG. 31, attenuation poles exist at the positions denoted by reference numerals frb and fra. As the frequency of fra increases, the steepness of the filter characteristics is enhanced. Conversely, as the frequency of fra decreases, the steepness in the lower range of the pass band decreases. The frequency of frb does not substantially influence the filter characteristics because fra is the attenuation pole closest the pass band.

Accordingly, in the parallel arm resonator that generates the attenuation pole in the lower range closest to the pass band, by reducing the capacitance or increasing the impedance, the steepness in the vicinity of the pass band in its lower range is greatly improved.

However, to produce an attenuation pole in a frequency range spaced from the pass band, the capacitance ratio Cp/Cs must be increased and there is an optimal value for the total capacitance $C_0P$ of the parallel arm resonators. Thus, in a ladder circuit type SAW filter device having a plurality of series arm resonators and a plurality of parallel arm resonators, the ratio Cp2/Cp1 of the capacitance of a second parallel arm resonator to the capacitance of a first parallel arm resonator is preferably about 2, and the sum of the capacitances Cp1 and Cp2 is set to $C_0P$, wherein the steepness of the filter characteristics is greatly improved and the attenuation outside of the pass band is greatly improved. In other words, the capacitance Cp1 of the first parallel arm resonator improves the steepness of the filter characteristics in the vicinity of the pass band in its lower range, and the capacitance Cp2 of the second parallel arm resonator produces attenuation in a range spaced from the pass band.

2. Improvement in Higher Range of Pass Band

Next, the improvement in attenuation in the higher range of the pass band in accordance with preferred embodiments of the present invention is described below.

As described above, the structure described in Japanese Unexamined Patent Application Publication No. 11-55067 has a problem in that attenuation is reduced in a range higher than a pass band.

By reducing the inductance of an inductor connected in series to the parallel arm resonator connected to the node between the series arm resonators, the resonance frequency increases according to the relationship indicated by expression (1). Therefore, the frequency distance between attenuation poles of the first and second parallel arm resonators decreases, thus resulting in an improvement in the attenuation in the entire higher range of the pass band.

Figure 11:
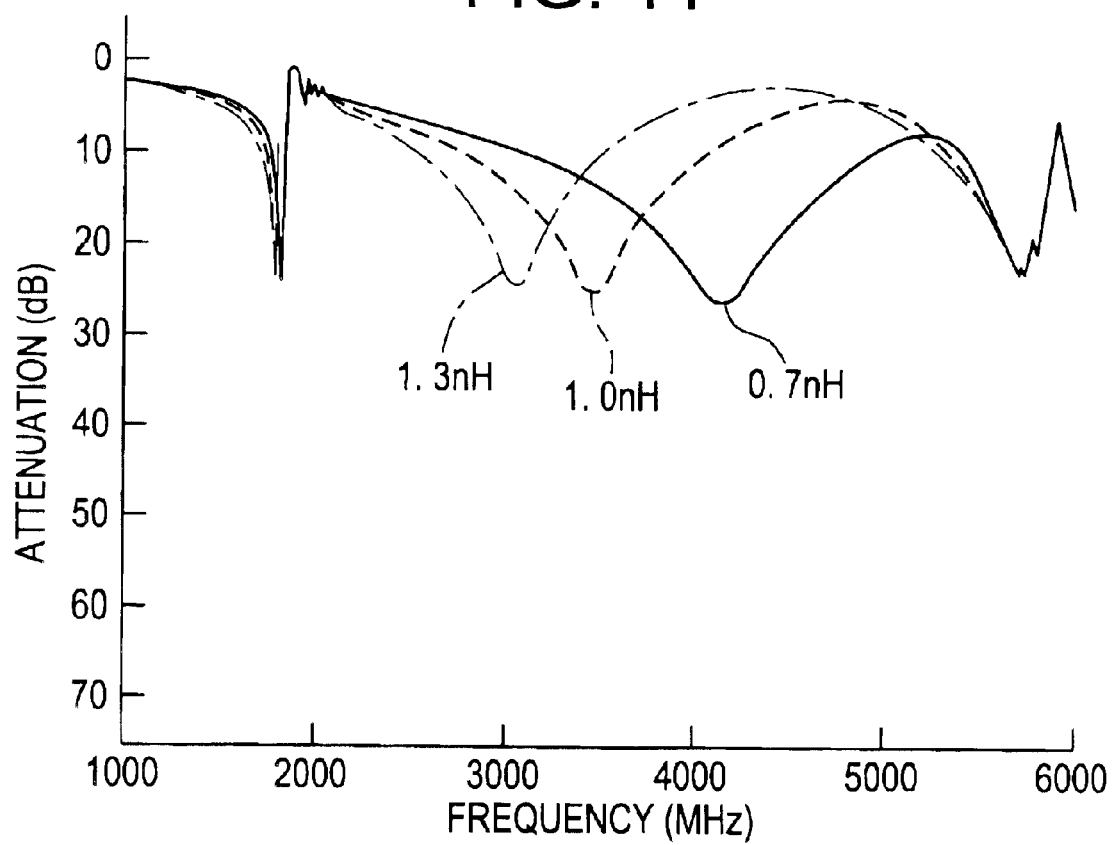
FIG. 11 is a graph showing changes in transmission characteristics obtained when the ratio the capacitance of the parallel arm resonator P1 to the capacitance of the parallel arm resonator P2 is set at 1:3 and the inductance of an inductor connected to the parallel arm resonator P2 is changed in the circuit configuration shown in FIG. 8.

A more detailed description is as follows. The circuit shown in FIG. 8 is used. The ratio of the capacitance of a parallel arm resonator P1 to the capacitance of a parallel arm resonator P2 is preferably about 1:3. While the inductance Lw of an inductor connected to the parallel arm resonator P1 is fixed at approximately 1.0 nH, the inductance Lw of an inductor connected to the parallel arm resonator P2 is changed to about 0.7 nH, about 1.0 nH, and about 1.3 nH. Characteristics obtained in this case are shown in FIG. 11. In FIG. 11, the solid line indicates the case where the inductance Lw of the inductor connected to the parallel arm resonator P2 is about 0.7 nH, the broken line indicates the case where Lw is about 1.0 nH, and the chain line indicates the case where Lw is about 1.3 nH.

As shown in FIG. 11, when the inductance Lw of the inductor connected to the parallel arm resonator P2 is increased, the distance between the attenuation poles of the parallel arm resonators P1 and P2 is too large, and the total attenuation deteriorates. Conversely, by setting the inductance Lw of the inductor connected to the parallel arm resonator P2 at about 1 nH, the attenuation is improved. By setting the inductance Lw at about 0.7 nH, the attenuation is greatly improved.

When the ratio Cp2/Cp1 is at least about 2, reflection characteristics deteriorate, as shown in the Japanese Unexamined Patent Application Publication No. 11-55067. When the lower range of the pass band has bad reflection characteristics, loss and the steepness of the filter characteristics deteriorate. This deterioration is eliminated by lowering the resonance frequency of the second parallel arm resonator, that is, by providing a parallel arm resonator having a large electrode capacitance. This solution is described below with reference to FIGS. 12 and 13.

Figure 12:
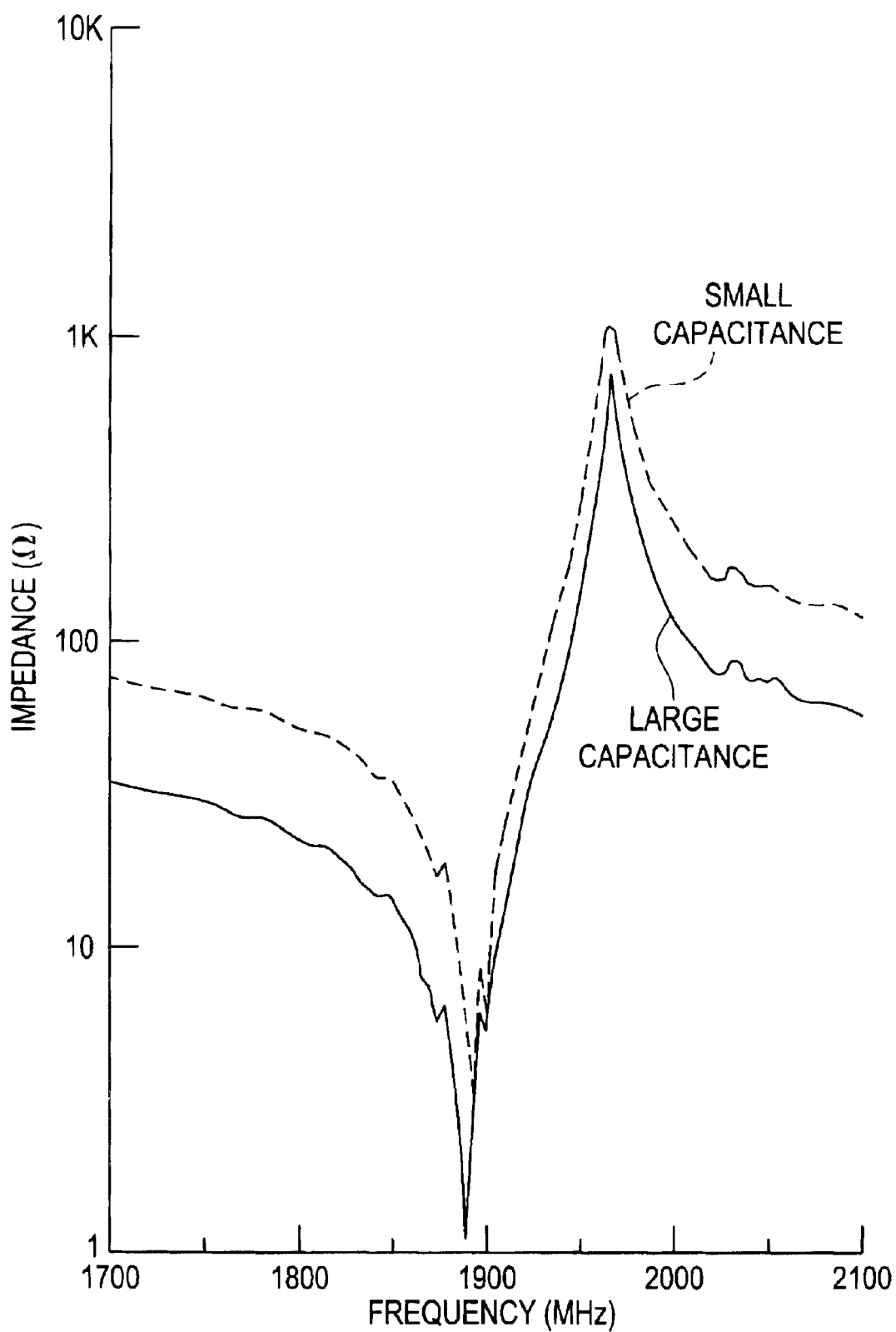
FIG. 12 is a graph showing the impedance characteristics of SAW resonators having different capacitances.

FIG. 12 shows impedance characteristics where a SAW resonator has a large electrode capacitance and where a SAW resonator has a small electrode capacitance. As shown in FIG. 12, the impedance of the SAW resonator having a large electrode capacitance is lower overall. Where a SAW resonator is used as a parallel arm resonator of a ladder circuit type SAW filter, the range (fr to fa in FIG. 13) between the resonance frequency and the anti-resonance frequency of the SAW resonator defines the lower range of the pass band. Thus, when the capacitance Cp2 of the second parallel arm resonator is increased, the impedance in the lower range of the pass band decreases from its optimal value. In other words, when the capacitance of the second parallel arm resonator is increased such that the relationship Cp1×2<Cp2 is satisfied, the impedance in the lower range of the pass band decreases from its optimal value.

In addition, the SAW resonator in FIG. 12 having a large electrode capacitance is changed, and its resonance frequency is lowered by about 10 MHz. Impedance characteristics obtained in this case are indicated by the solid line shown in FIG. 13. For comparison, the impedance characteristics of the SAW resonator in FIG. 12 having a small electrode capacitance are indicated by the broken line in FIG. 13.

Figure 13:
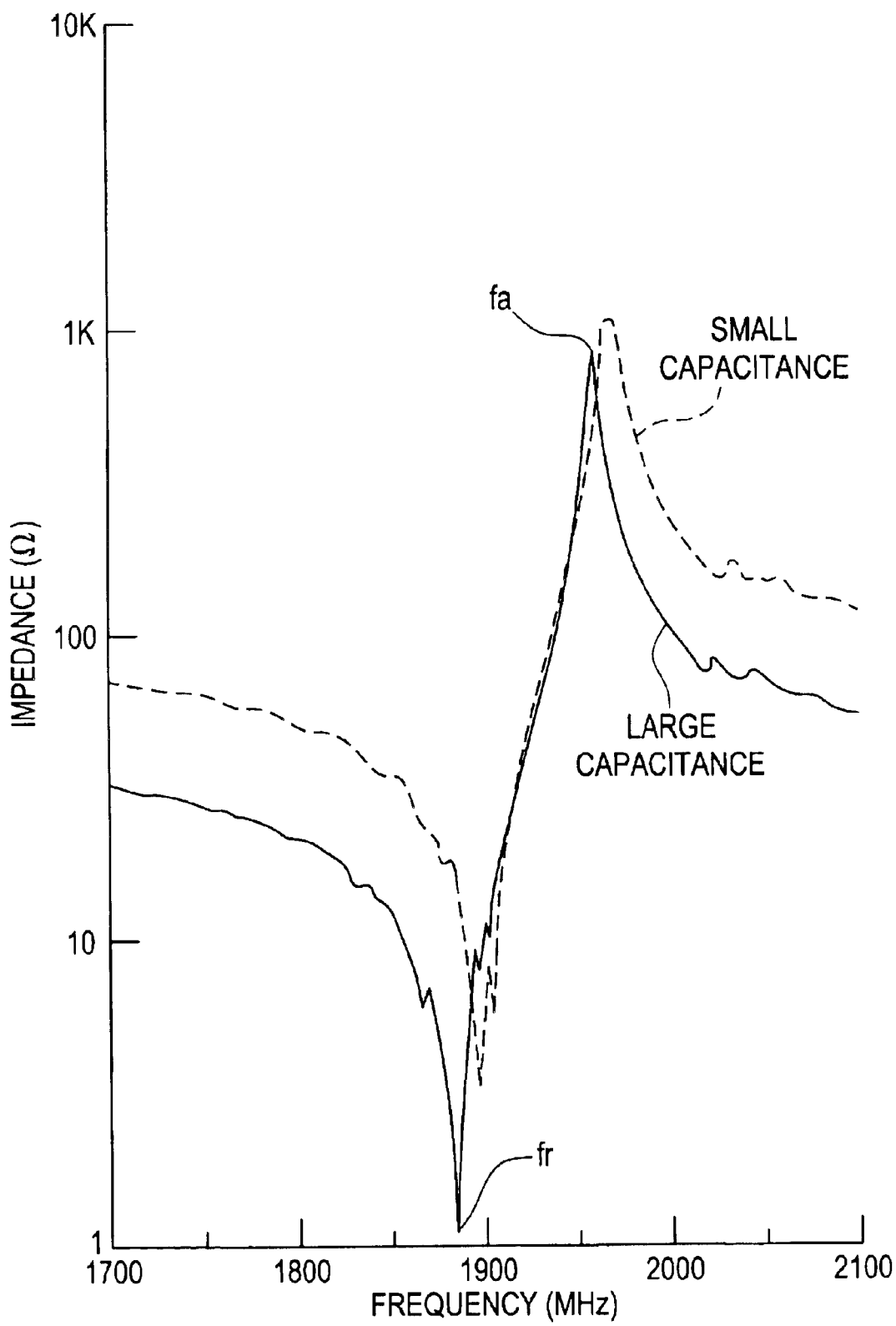
FIG. 13 is a graph showing impedance characteristics obtained when a frequency is reduced by 10 MHz in the SAW filter shown in FIG. 12 having a large capacitance and the impedance characteristics of the SAW resonator shown in FIG. 12 having small capacitance.

As shown in FIG. 13, by lowering the resonance frequency of the SAW resonator having the large capacitance, the impedance in the frequency range fr to fa which corresponds to the lower range of the pass band is very similar to the impedance of the SAW resonator having the small capacitance. Accordingly, by changing the capacitance and lowering the resonance frequency of the resonator having the large capacitance, the impedance in the lower range of the pass band is adjusted to an optimal value, wherein preferable impedance matching is achieved and the reflection characteristics are greatly improved.

As described above, in preferred embodiments of the present invention, the steepness of the filter characteristics in the vicinity of the pass band is improved because the capacitances Cp1 and Cp2 of the first and second parallel arm resonators satisfy the relationship Cp1×2<Cp2, and the attenuation in the higher range of the pass band is achieved because the inductance of the inductor connected to the second parallel arm resonator is not greater than the inductance of the inductor connected in series to the first parallel arm resonator.

Next, specific preferred embodiments of the present invention are described below.

Figure 1:
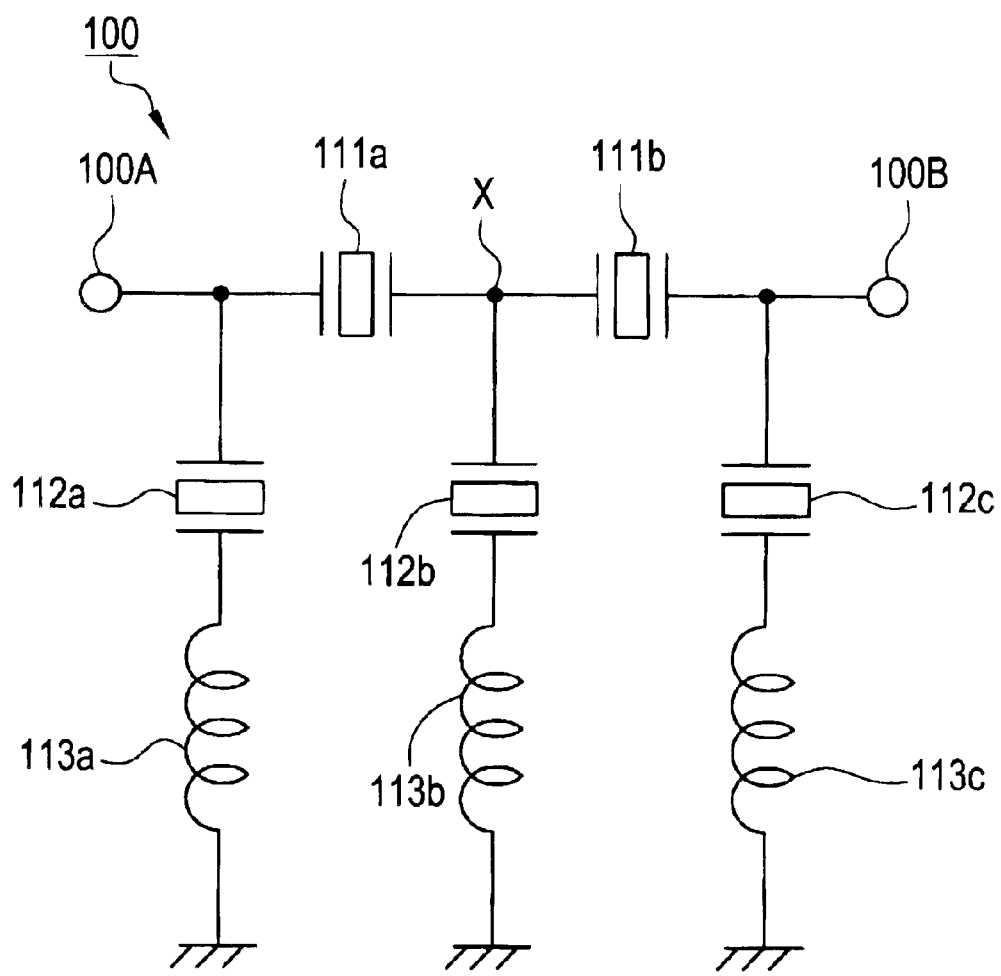
FIG. 1 is a block diagram showing a SAW filter device according to a first preferred embodiment of the present invention.
Figure 14:
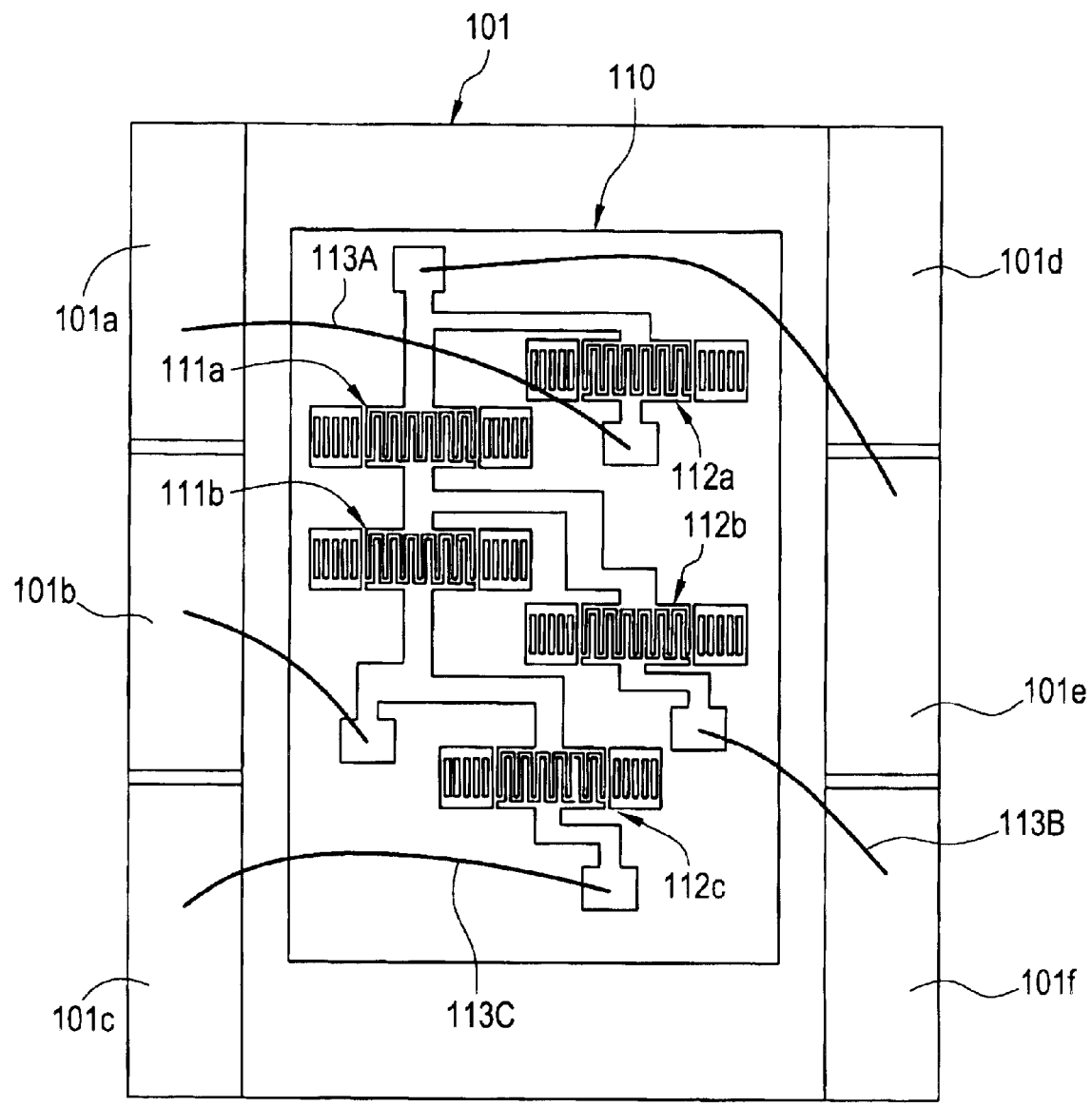
FIG. 14 is a schematic plan view showing a SAW filter device according to a first preferred embodiment of the present invention.

FIG. 1 shows the circuit structure of a SAW filter 100 according to a first preferred embodiment of the present invention, and FIG. 14 is a schematic plan view of the circuit structure.

As shown in FIG. 1, the SAW filter 100 includes series arm resonators 111a and 111b provided in a series arm extending between an input end 100A and an output end 100B.

The SAW filter 100 includes three parallel arms in which parallel arm resonators 112a to 112c are provided. Inductors 113a to 113c are connected in series to the parallel arm resonators 112a to 112c, respectively, with one end of each parallel arm resonator grounded.

Among the parallel arm resonators 112a to 112c, the parallel arm resonators 112a and 112c define first parallel arm resonators and are respectively connected to the input/output ends 100A and 100B. The parallel arm resonator 112b defines a second parallel arm resonator according to the present invention and is connected to a junction X between the series arm resonators 111a and 111b.

A matching capacitor may be inserted between one of the input end 100A and the output end 100B, and the parallel arm resonators 112a to 112c.

As shown in FIG. 14, a SAW filter device 110 is accommodated in a package 101. The structure of the package 101 is not particularly limited. In the first preferred embodiment, the SAW filter device 110 is accommodated in a recess provided in the package 101. On the opposite sides of the SAW filter device 110, two upwardly projecting step portions are provided. Electrode pads 101a to 101c are provided on one of the step portions, and electrode pads 101d to 101f are provided on the other step portion.

The SAW filter device 110 includes the series arm resonators 111a and 111b, the parallel arm resonators 112a to 112c, and a wiring pattern for connection therebetween provided on a 36-degree Y-cut X-transmission LiTaO$_3$ substrate. As shown in FIG. 14, the series arm resonators 111a and 111b and the parallel arm resonators 112a to 112c are each defined by a SAW resonator including a single interdigital transducer (IDT) and reflectors provided on two sides of the IDT in the direction in which surface waves of the IDT are propagated.

The series arm resonators 111a and 111b each have an electrode-finger crossing width of about 40 $\mu$m, 105 pairs of electrode fingers of the IDT, 100 electrode fingers of each reflector, and an electrode-finger pitch of about 2.07 $\mu$m (the surface wave wavelength γ is about 4.14 $\mu$m), and are identical in structure.

Regarding the parallel arm resonators 112a to 112c, the crossing width varies and the ratio of each capacitance Cp1 of the first parallel arm resonators 112a and 112c to the capacitance Cp2 of the second parallel arm resonator 112b also varies, wherein a plurality of types of SAW devices are provided. The electrode parameters of each parallel arm resonator are as shown in the following table 2.

TABLE 2

| | Resonator 112a, 112c | | | Resonator 112b | | | |
|---|---|---|---|---|---|---|---|
| No. | No. of Pairs | Crossing Width ($\mu$m) | Electrode Pitch ($\mu$m) | No. of Pairs | Crossing Width ($\mu$m) | Electrode Pitch ($\mu$m) | Capacitance Ratio |
| 1 | 45 | 100 | 2.141 | 45 | 200 | 2.142 | 1:2 |
| 2 | 45 | 80 | 2.141 | 45 | 240 | 2.148 | 1:3 |
| 3 | 45 | 66 | 2.141 | 45 | 265 | 2.153 | 1:4 |
| 4 | 45 | 57 | 2.141 | 45 | 286 | 2.157 | 1:5 |
| 5 | 45 | 50 | 2.141 | 45 | 300 | 2.16 | 1:6 |
| 6 | 45 | 44.4 | 2.141 | 45 | 312 | 2.162 | 1:7 |
| 7 | 45 | 40 | 2.141 | 45 | 320 | 2.166 | 1:8 |
| 8 | 45 | 33.3 | 2.141 | 45 | 333 | 2.169 | 1:10 |
| 9 | 45 | 28.6 | 2.141 | 45 | 342 | 2.171 | 1:12 |
| 10 | 45 | 23.4 | 2.141 | 45 | 355 | 2.173 | 1:15 |

The parallel arm resonators 112a to 112c are electrically connected via boding wires 113A to 113C to the electrode pads 101a, 101f, and 101c which are grounded. The length of each of the bonding wires 113A and 113C is set such that an inductance of approximately 1 nH is generated. The length of the bonding wire 113B is shorter than the length of each of the bonding wires 113A and 113C such that an inductance of approximately 0.7 nH is generated.

Each SAW filter device has a ratio of the capacitance Cp2 of the second parallel arm resonator to each capacitance Cp1 of the first parallel arm resonators 112a and 112c that is adjusted by adjusting the electrode-finger crossing width of the parallel arm resonators 112a to 112c, and the steepness in the lower range of the pass band of the SAW filter device was measured. The electrode capacitance was adjusted by changing the crossing width since the electrode capacitance is proportional to the number of pairs of electrode fingers and to the crossing width.

The steepness was evaluated by measuring a frequency distance between a frequency position having an attenuation of 4 dB and a frequency position having an attenuation of 12 dB in the lower range of the pass band. The results are shown in FIG. 15.

Figure 15:
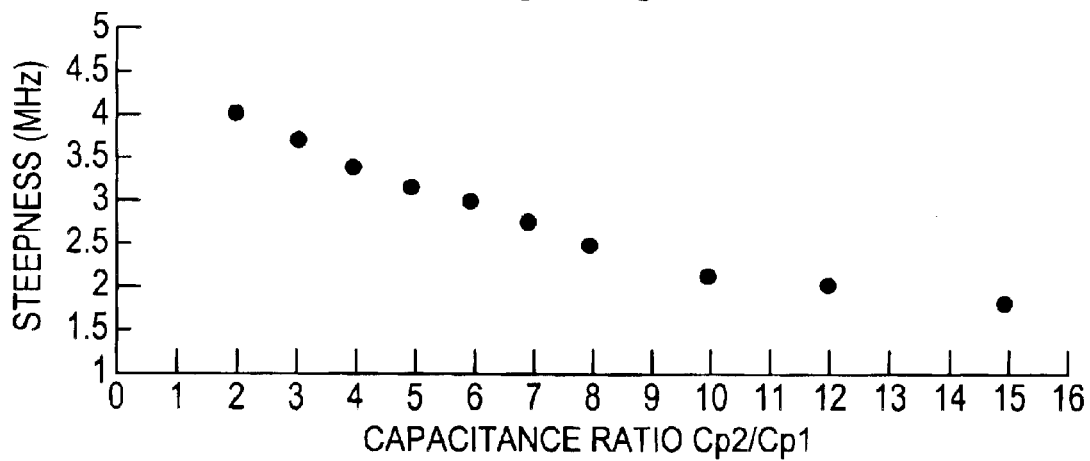
FIG. 15 is a graph showing changes in the steepness of the filter characteristics in the lower range of a pass band where the capacitance ratio Cp2/Cp1 is changed in the first preferred embodiment of the present invention.

As shown in FIG. 15, compared to the prior art example in which the capacitance ratio Cp2/Cp1 is 2, the steepness is improved in proportion to the enhancement of the capacitance ratio Cp2/Cp1. This is because the impedance increases as each capacitance Cp1 of the first parallel arm resonators 112a and 112c, which are positioned at both ends, decreases.

Figure 16:
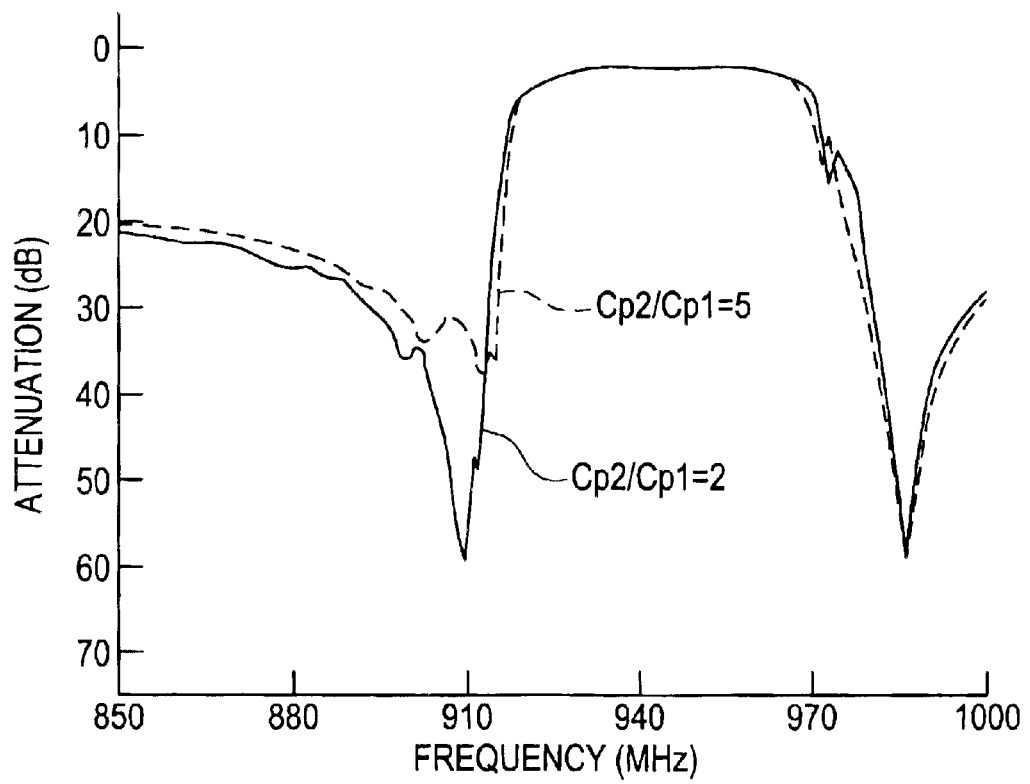
FIG. 16 is a graph showing the transmission characteristics of a SAW filter device where the capacitance ratio Cp2/Cp1=2, which corresponds to a prior art example, and the transmission characteristics of the SAW filter device according to the first preferred embodiment of the present invention.

Characteristics, obtained both in prior art example in which the capacitance ratio Cp2/Cp1 is 2 and in the case of the capacitance ratio Cp2/Cp1=5, are indicated as typical frequency characteristics by the solid line and the broken line shown in FIG. 16, respectively.

As shown in FIG. 16, by setting the capacitance ratio Cp2/Cp1=5 (broken line), the steepness in the lower range is enhanced to a greater extent than in the prior art example.

Figure 17:
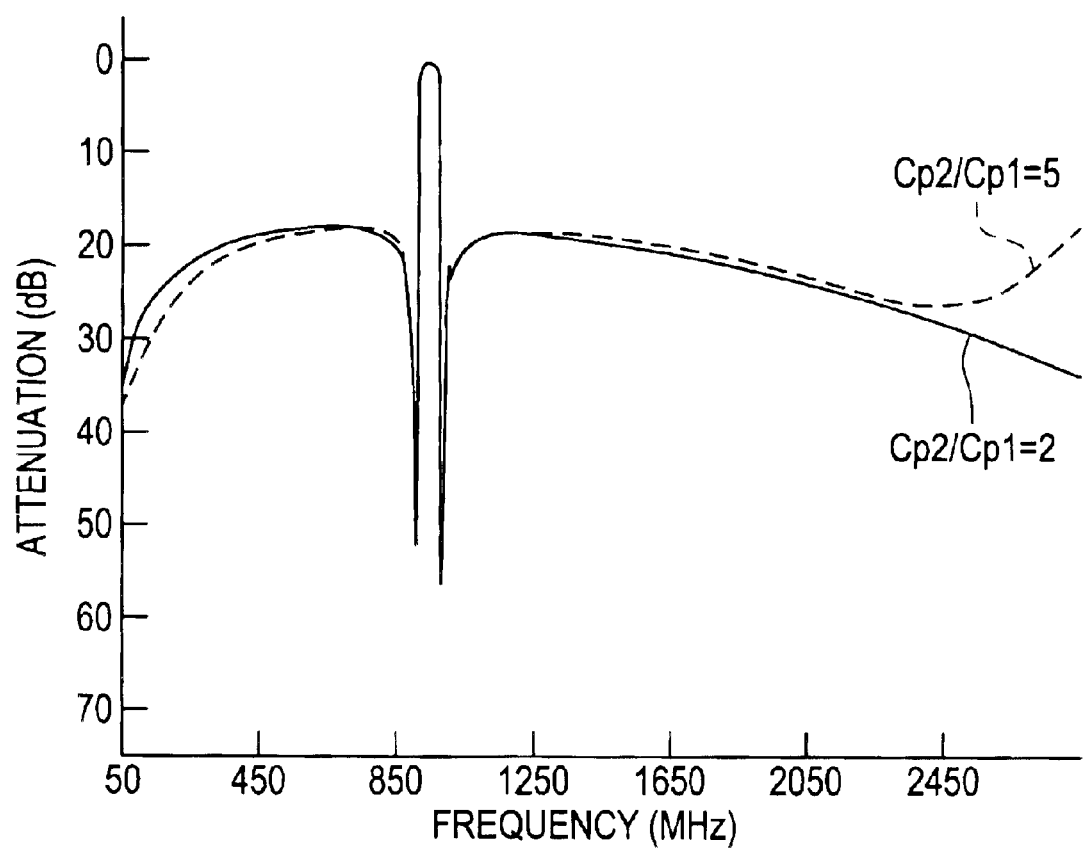
FIG. 17 is a graph showing the transmission characteristics shown in FIG. 16 in a broader frequency range.

Also, in FIG. 17, the characteristics shown in FIG. 16 are shown in a broader frequency range. As shown in FIG. 17, where the capacitance ratio Cp2/Cp1=5, attenuation does not deteriorate up to the about 2700 MHz because an inductance caused by the bonding wire 113B connected to the second parallel arm resonator 112b has a small value of about 0.7 nH.

Figure 18:
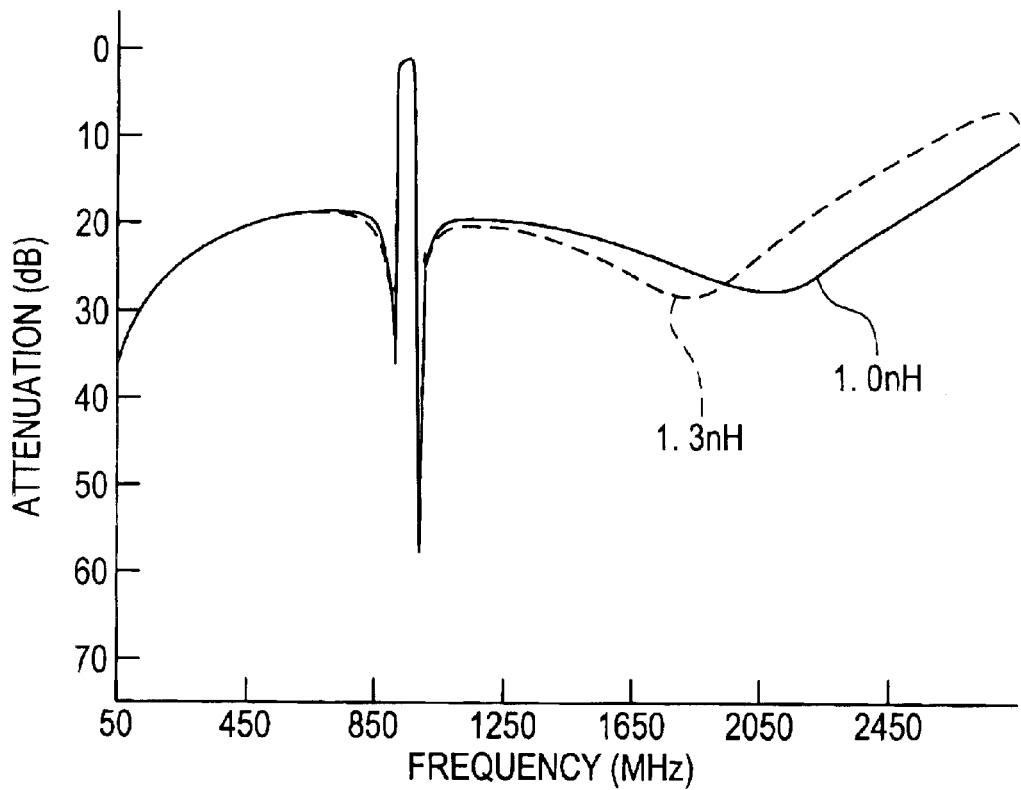
FIG. 18 is a graph showing the transmission characteristics of the SAW filter device according to the first preferred embodiment where the capacitance ratio is set to Cp2/Cp1=5 and setting the inductance of an inductor connected to a second parallel arm resonator to different values.

For comparison, FIG. 18 shows frequency characteristics obtained in examples in which, in the above SAW filter device having the capacitance ratio Cp2/Cp1=5, the bonding wire 113B is connected to the second parallel arm resonator 112b such that an inductance of about 1.0 nH is generated and such that an inductance of about 1.3 nH is generated. In FIG. 18, the solid line indicates the example of an inductance of about 1.0 nH, and the broken line indicates the example of an inductance of about 1.3 nH. As clearly seen in FIG. 18, as the inductance of the bonding wire 113B connected to the second parallel arm resonator 112b increases, attenuation in the vicinity of 2700 MHz deteriorates.

As shown in table 2, the electrode pitch of the second parallel arm resonator 112b in the center is changed, and as the electrode pitch increases, the capacitance ratio increases. This means that the frequency of the second parallel arm resonator 112b decreases. In other words, although an increase in the capacitance ratio Cp2/Cp1 increases a loss caused by impedance matching in the lower range of the pass band and reduces the steepness, the frequency is decreased by increasing the electrode pitch of the second parallel arm resonator 112b, and the steepness is prevented from deteriorating.

Figure 19:
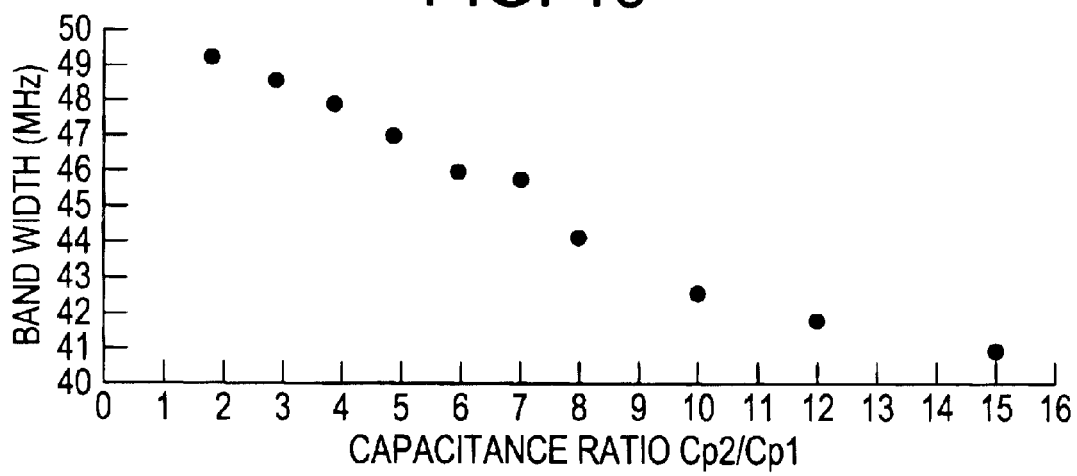
FIG. 19 is a graph showing a relationship between the capacitance ratio Cp2/Cp1 and bandwidth in the first preferred embodiment of the present invention.

FIG. 19 shows the relationship between the capacitance ratio Cp2/Cp1 and bandwidth of the SAW filter device according to the first preferred embodiment. The bandwidth is the width of a band in which attenuation is about 4 dB.

As disclosed in Japanese Unexamined Patent Application Publication No. 5-183380, when an inductor is connected in series to a parallel arm resonator, the resonance frequency decreases and a pass band broadens. However, a reduction in the capacitance of the parallel arm resonator prevents the resonance frequency from shifting and reduces the pass band.

As shown in FIG. 15, as the capacitance ratio increases, the more the steepness is enhanced, but the degree of improvement in the steepness decreases when the capacitance ratio Cp2/Cp1 is 10 or greater. Thus, it is preferable to set the capacitance ratio Cp2/Cp1 at about 2 to about 10. By using this range, filter characteristics having good steepness and relatively broad bandwidth are obtained.

Figure 20:
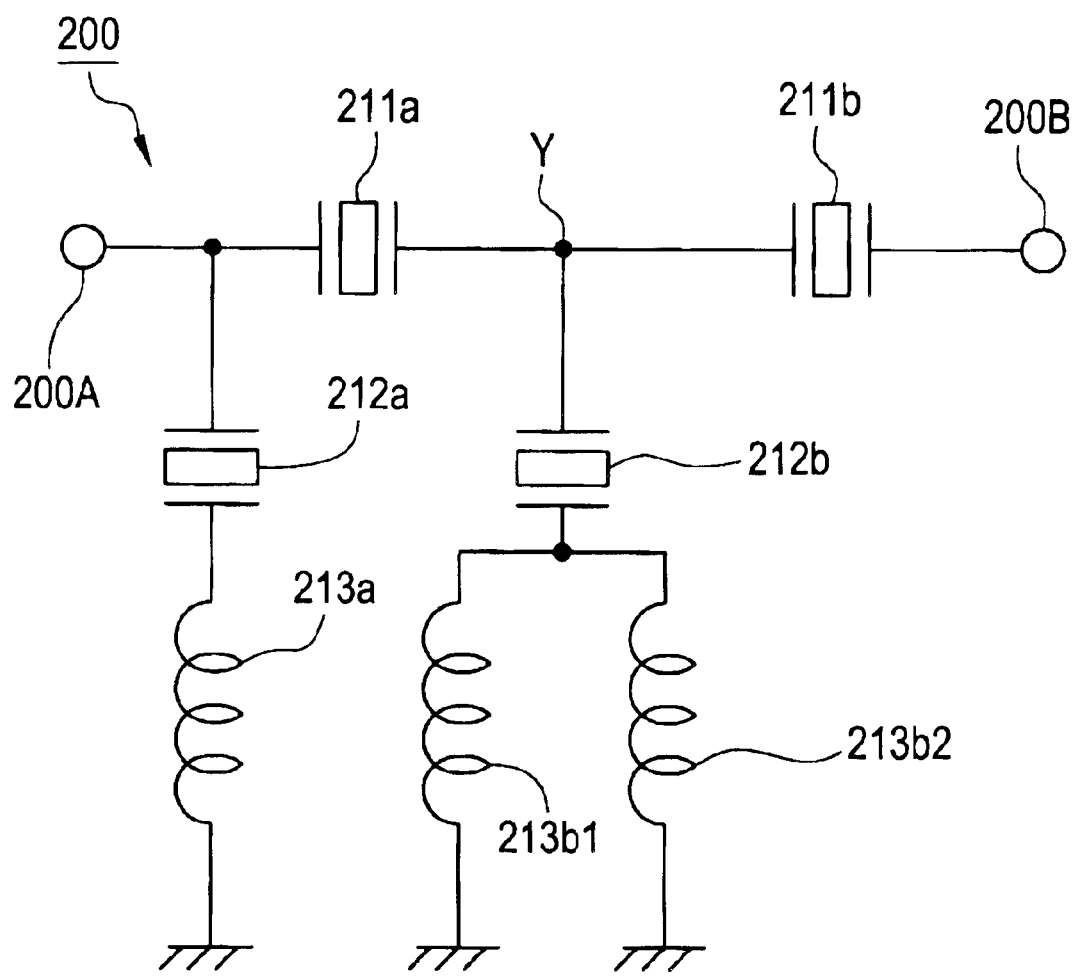
FIG. 20 is a circuit diagram showing the circuit configuration of a SAW filter device according to a second preferred embodiment of the present invention.
Figure 21:
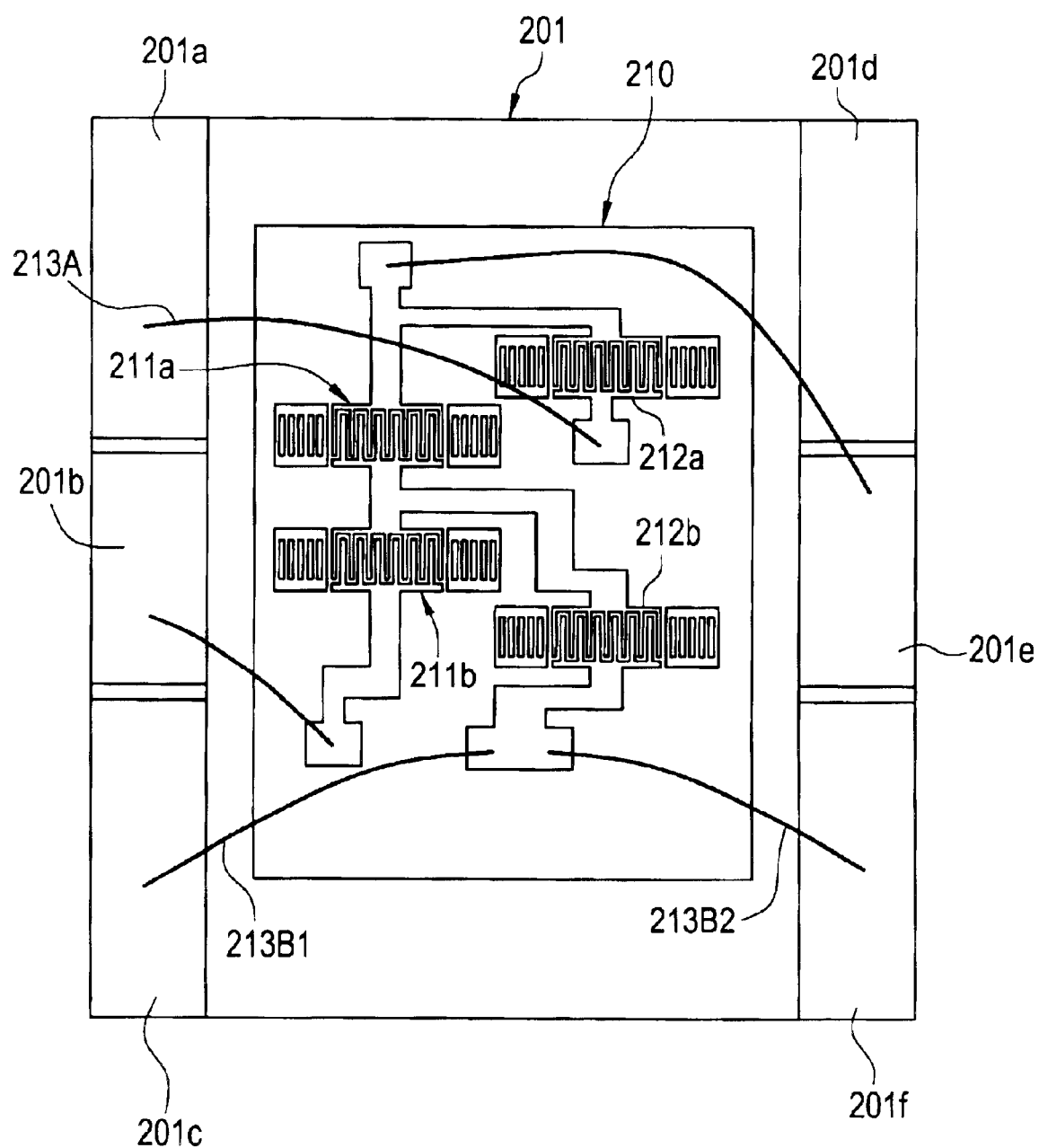
FIG. 21 is a schematic plan view showing a SAW filter device according to the second preferred embodiment of the present invention.

FIG. 20 shows the circuit structure of a SAW filter device 200 according to a second preferred embodiment of the present invention, and FIG. 21 is a schematic plan view of the above circuit structure.

The SAW filter device 200 includes series arm resonators 211a and 211b provided in a series arm extending between an input end 200A and an output end 200B. A first parallel arm resonator 212a is connected to the input end 200A, and an inductor 213a is connected to the first parallel arm resonator 212a. A second parallel arm resonator 212b is connected to a junction V between the series arm resonators 211a and 211b. Inductors 213b1 and 213b2 are connected in series to the parallel arm resonator 212b, with one end of each Inductor grounded. The inductors 213b1 and 213b2 are connected to each other in parallel.

A package 201 preferably has the same structure as the package in the first preferred embodiment. The package 201 includes electrode pads 201a to 201f. A SAW filter device 210 is provided such that the series arm resonators 211a and 211b, the parallel arm resonators 212a and 212b, and a wiring pattern for connection therebetween are provided on a piezoelectric substrate identical to that in the first preferred embodiment.

The series arm resonators 211a and 211b and the parallel arm resonators 212a and 212b are defined by SAW resonators similarly to the first preferred embodiment.

More specifically, in the SAW filter device 200, a crossing width in the IDT of the series arm resonator 212a is about 40 μm, the number of pairs of electrode fingers is 105, the number of electrode fingers of each reflector is 100, and an electrode-finger pitch is about 2.07 μm, that is, SAW wavelength γ is about 4.14 μm. The series arm resonator 211b is constructed identically to the series arm resonator 211a, except for having a crossing width of about 80 μm.

The parallel arm resonators 212a and 212b have various crossing widths as shown in the following table 3. By using the crossing widths, a plurality of types of the SAW filter device 200 were produced which had different capacitance ratio of the capacitance Cp2 of the parallel arm resonator 212b to the capacitance Cp1 of the parallel arm resonator 212a. The electrode parameters of the parallel arm resonators 212a and 212b are as shown in the following table 3.

TABLE 3

| | Resonator 212a | | | Resonator 212b | | | |
|---|---|---|---|---|---|---|---|
| No. | No. of Pairs | Crossing Width (μm) | Electrode Pitch (μm) | No. of Pairs | Crossing Width (μm) | Electrode Pitch (μm) | Capacitance Ratio |
| 1 | 45 | 100 | 2.141 | 45 | 200 | 2.142 | 1:2 |
| 2 | 45 | 75 | 2.141 | 45 | 225 | 2.148 | 1:3 |
| 3 | 45 | 60 | 2.141 | 45 | 240 | 2.153 | 1:4 |
| 4 | 45 | 50 | 2.141 | 45 | 250 | 2.157 | 1:5 |
| 5 | 45 | 43 | 2.141 | 45 | 257 | 2.16 | 1:6 |
| 6 | 45 | 37.5 | 2.141 | 45 | 262.5 | 2.162 | 1:7 |
| 7 | 45 | 33.3 | 2.141 | 45 | 266.7 | 2.166 | 1:8 |
| 8 | 45 | 27.2 | 2.141 | 45 | 272 | 2.169 | 1:10 |
| 9 | 45 | 23.1 | 2.141 | 45 | 276.9 | 2.171 | 1:12 |
| 10 | 45 | 18.8 | 2.141 | 45 | 281.2 | 2.173 | 1:15 |

The parallel arm resonators 212a and 212b are electrically connected via bonding wires 213A, and 213B1 and 213B2 to the electrode pads 201a, 201c, and 201f. In this case, the length of the bonding wire 213A is selected such that an inductance of approximately about 1 nH is generated by the bonding wire 213A. The bonding wires 213B1 and 213B2 are connected to the electrode pads 201c and 201f, which are separate, wherein an inductor defined by bonding wires 213B1 and 213B2 having an inductance of about 0.55 nH is connected in series between the parallel arm resonator 212b and the ground potential.

Figure 22:
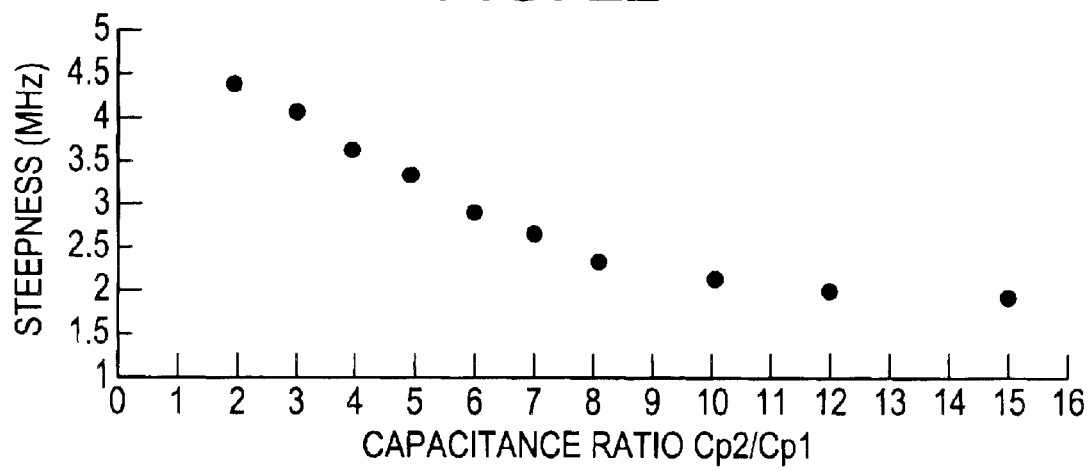
FIG. 22 is a graph showing a relationship between the capacitance ratio Cp2/Cp1 and steepness in the second preferred embodiment of the present invention.

A relationship between the steepness in the lower range of the pass band and the capacitance ratio in each type of SAW filter device 200 was measured. The results are shown in FIG. 22. The steepness of the filter characteristics was evaluated in a similar manner as in the first preferred embodiment.

As clearly shown in FIG. 22, as the capacitance ratio Cp2/Cp1 is increased, the steepness is improved, as compared with the case of the capacitance ratio Cp2/Cp1=2 that corresponds to the prior art example. This is because the capacitance Cp1 of the first parallel arm resonator 212a substantially decreases which results in a high impedance.

Figure 23:
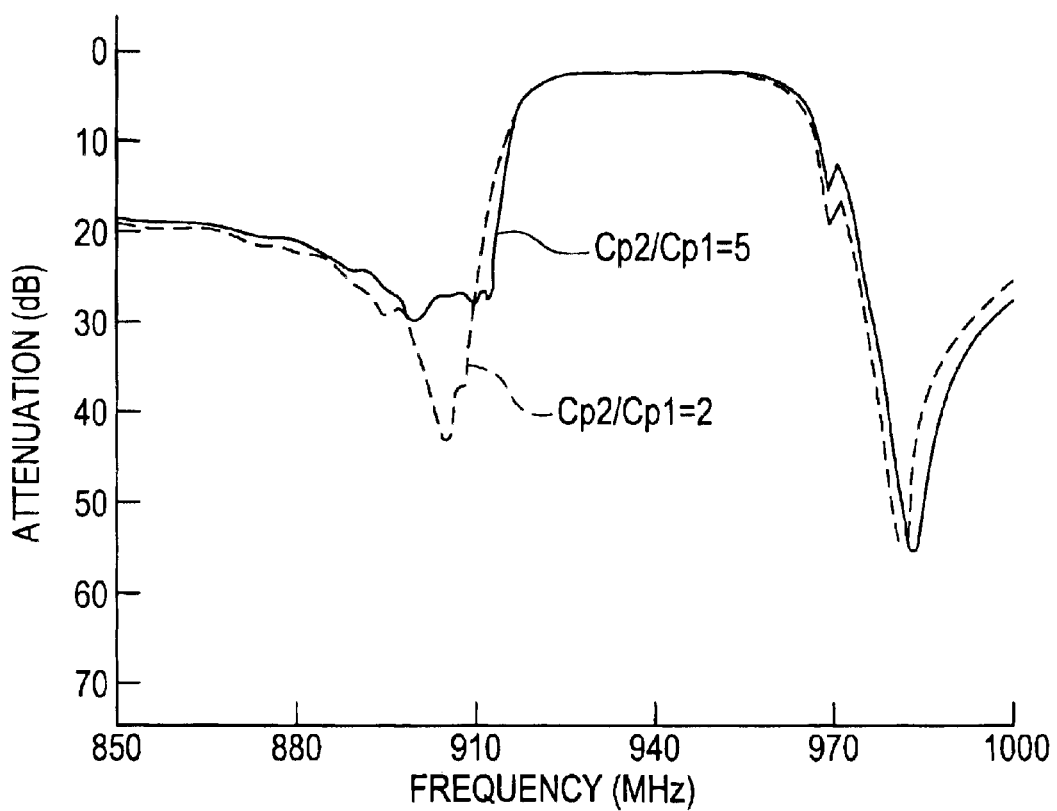
FIG. 23 is a graph showing the transmission characteristics of the SAW filter device according to the second preferred embodiment (the capacitance ratio Cp2/Cp1=5) and each SAW filter device according to the prior art (the capacitance ratio Cp2/Cp1=2).

Transmission characteristics in the related art example in which the capacitance ratio Cp2/Cp1=2 and in the case of the capacitance ratio Cp2/Cp1=5 are shown as typical characteristics in FIG. 23. In FIG. 23, the solid line indicates the second preferred embodiment and broken line indicates the prior art example.

As clearly shown in FIG. 23, when the capacitance ratio Cp2/Cp1=5, the steepness in the lower range of the pass band is greatly enhanced. Additionally, the transmission characteristics in a broader frequency range are shown in FIG. 24.

Figure 24:
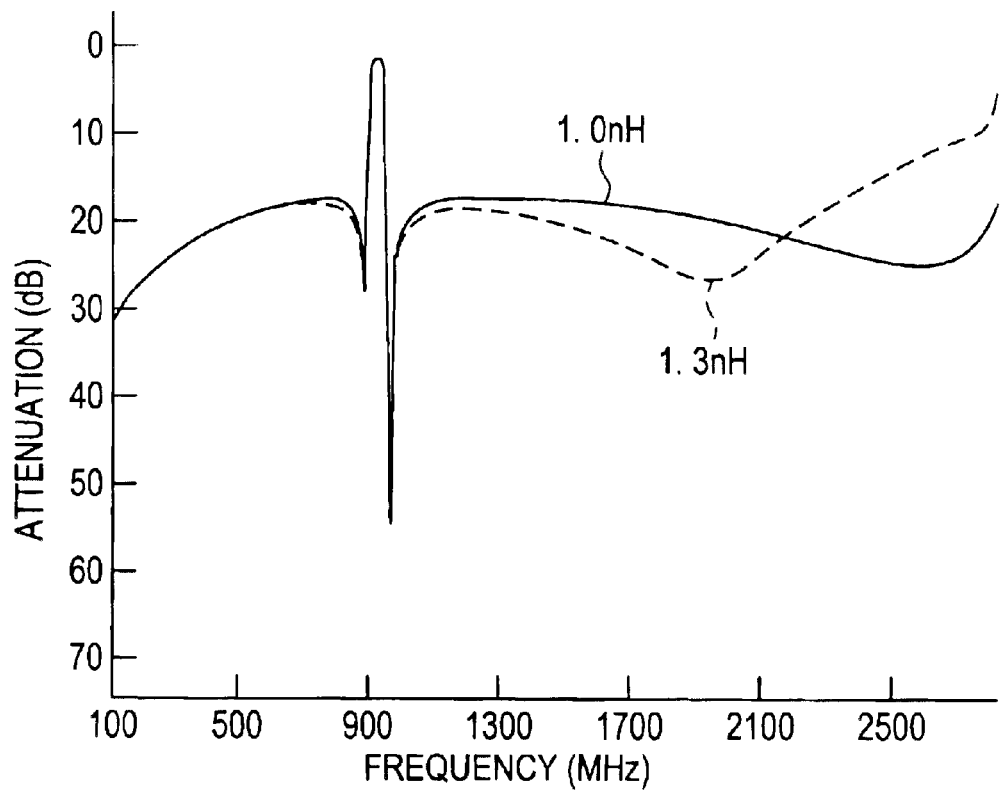
FIG. 24 is a graph showing changes in the transmission characteristics of the SAW filter device according to the second preferred embodiment where the inductance of an inductor connected to a second parallel arm resonator is changed.

FIG. 24 shows frequency characteristics where the total inductance of the bonding wires 113B1 and 113B2 is about 1.3 nH and about 1.0 nH. As seen in FIG. 24, when the inductance of the inductor connected to the parallel arm resonator 212b having a large capacitance is increased, attenuation in the vicinity of 2700 MHz deteriorates.

The relationship between the capacitance ratio and the steepness of the filter characteristics and the relationship between the inductance and the attenuation exhibit tendencies similar to the first preferred embodiment having three parallel arm resonators.

Therefore, with the first and second preferred embodiments that provide a ladder circuit type SAW filter including at least two series arm resonators and at least two parallel arm resonators, advantages are obtained in a configuration having symmetric input and output portions as in the first preferred embodiment, and also in a configuration having asymmetric input and output portions as in the second preferred embodiment.

A ladder circuit type SAW filter device according to a third preferred embodiment having a central frequency of 1960 MHz is described below. The circuit configuration in the third preferred embodiment is identical to that of the first preferred embodiment. Accordingly, the third preferred embodiment is described with reference to FIGS. 1 and 14, which are referred to when describing the first preferred embodiment.

In the third preferred embodiment, each of the series arm resonators 111a and 111b have a crossing width of about 20 μm, 100 pairs of the IDT, 100 electrode fingers of each reflector, and an electrode pitch of about 1.00 μm (SAW wavelength γ is about 2.00 μm). The series arm resonators 111a and 111b have identical structure.

Regarding the parallel arm resonators 112a to 112c, by setting the crossing widths to different values, different capacitance ratios of the capacitance Cp2 to Cp1 were produced. The electrode parameters of the parallel arm resonators 112a to 112c are shown in the following table 4.

TABLE 4

| | Resonators 312a, 312c | | | Resonator 312b | | | |
|---|---|---|---|---|---|---|---|
| No. | No. of Pairs | Crossing Width (μm) | Electrode Pitch (μm) | No. of Pairs | Crossing Width (μm) | Electrode Pitch (μm) | Capacitance Ratio |
| 1 | 45 | 50 | 1.043 | 45 | 100 | 1.043 | 1:2 |
| 2 | 45 | 40 | 1.043 | 45 | 120 | 1.047 | 1:3 |
| 3 | 45 | 33 | 1.043 | 45 | 132 | 1.049 | 1:4 |
| 4 | 45 | 28.5 | 1.043 | 45 | 143 | 1.051 | 1:5 |
| 5 | 45 | 25 | 1.043 | 45 | 150 | 1.053 | 1:6 |
| 6 | 45 | 22.2 | 1.043 | 45 | 156 | 1.055 | 1:7 |

TABLE 4-continued

| | Resonators 312a, 312c | | | Resonator 312b | | | |
| --- | --- | --- | --- | --- | --- | --- | --- |
| No. | No. of Pairs | Crossing Width (μm) | Electrode Pitch (μm) | No. of Pairs | Crossing Width (μm) | Electrode Pitch (μm) | Capacitance Ratio |
| 7 | 45 | 20 | 1.043 | 45 | 160 | 1.056 | 1:8 |
| 8 | 45 | 16.7 | 1.043 | 45 | 167 | 1.056 | 1:10 |
| 9 | 45 | 14.3 | 1.043 | 45 | 171.4 | 1.057 | 1:12 |
| 10 | 45 | 11.7 | 1.043 | 45 | 177.6 | 1.059 | 1:15 |

The lengths of the bonding wires 113A and 113C are relatively large such that the inductor connected in series to each of the parallel arm resonators 112a and 112c has an inductance of approximately about 1 nH. The length of the bonding wire 113B is relatively small such that the inductor connected in series to the parallel arm resonator 112b has an inductance of approximately about 0.7 nH.

A relationship between steepness in the lower range of the pass band and the capacitance ratio Cp2/Cp1 in each produced SAW filter device was measured. The steepness was evaluated in a similar manner as it the first preferred embodiment. The results are shown in FIG. 25.

Figure 25:
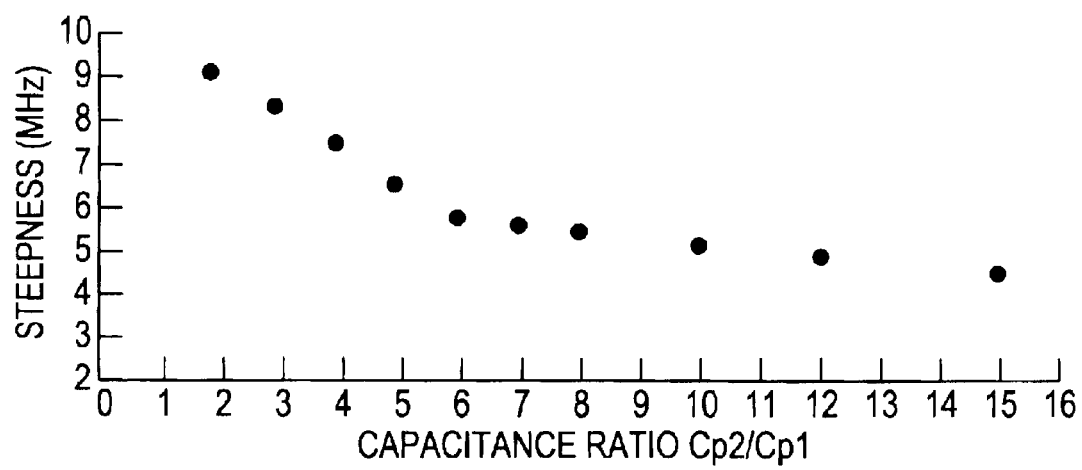
FIG. 25 is a graph showing a relationship between the capacitance ratio Cp2/Cp1 and the steepness of the filter characteristics in a SAW filter device according to a third preferred embodiment of the present invention.

As shown in FIG. 25, the steepness improves as the capacitance ratio Cp2/Cp1 increases, as compared with the case where the capacitance ratio Cp2/Cp1=2 which corresponds to the prior art example. The transmission characteristics of a prior art example in which the capacitance ratio Cp2/Cp1=2 and the transmission characteristics of a case in which the capacitance ratio Cp2/Cp1=5 are shown in FIG. 26.

Figure 26:
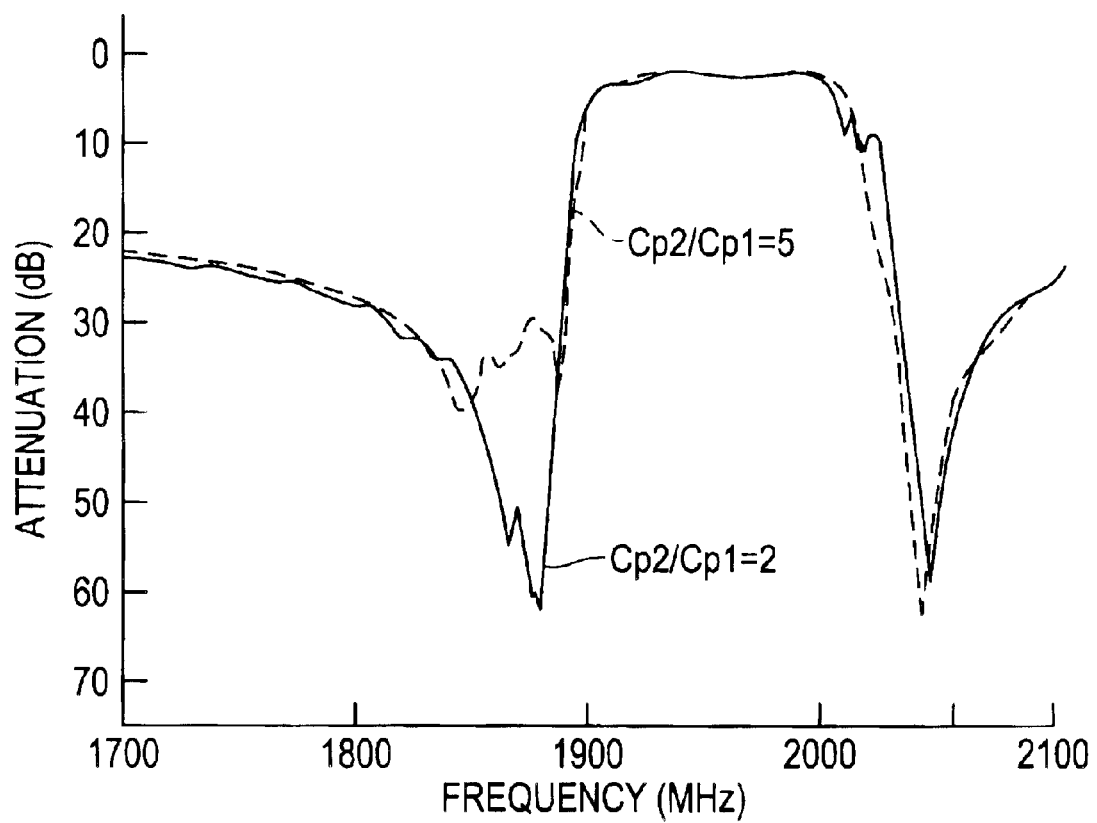
FIG. 26 is a graph showing the transmission characteristics of the SAW filter device according to the third preferred embodiment (the capacitance ratio Cp2/Cp1=5) and a comparative prior art SAW filter device (the capacitance ratio Cp2/Cp1=2).

As shown in FIG. 26, by setting the capacitance ratio Cp2/Cp1 at 5, the steepness is greatly enhanced as compared with the prior art example.

Figure 27:
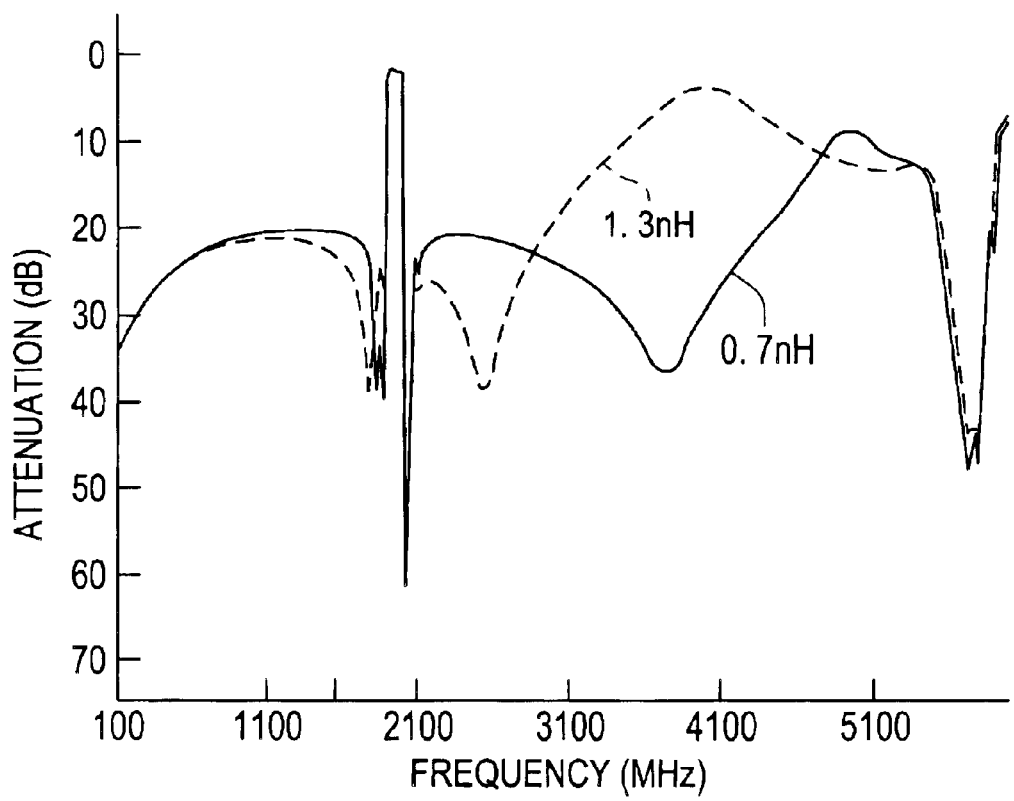
FIG. 27 is a graph showing changes in transmission characteristics where the inductance of an inductor connected to a second parallel arm resonator is changed.

Transmission characteristics in both a case in which the inductor connected to the parallel arm resonator 112b has a large value of about 1.3 nH and in the SAW filter device (the capacitance ratio Cp2/Cp1=5, the inductor connected to the parallel arm resonator 112b has an inductance of about 0.7 nH) according to the third preferred embodiment are shown in a broad frequency range in FIG. 27. In the third preferred embodiment, because the frequency is higher than in the first and second preferred embodiments, attenuation deteriorates in the vicinity of 5800 MHz which is a frequency approximately three times the pass band frequency. However, deterioration in the attenuation in the higher range of the pass band is suppressed.

A relationship between the capacitance ratio and the steepness of the filter characteristics and a relationship between the inductance and attenuation exhibit tendencies similar to that in the SAW filter device 100 of an 800-MHz ladder type according to the first preferred embodiment. According to the first and third preferred embodiments, irrespective of the magnitude of the central frequency, the steepness in the lower range of the pass band is greatly improved and deterioration of the attenuation is greatly suppressed in a broad frequency range.

Next, a communication apparatus in which SAW filter devices according to the present invention are used as bandpass filters is described below.

Figure 28:
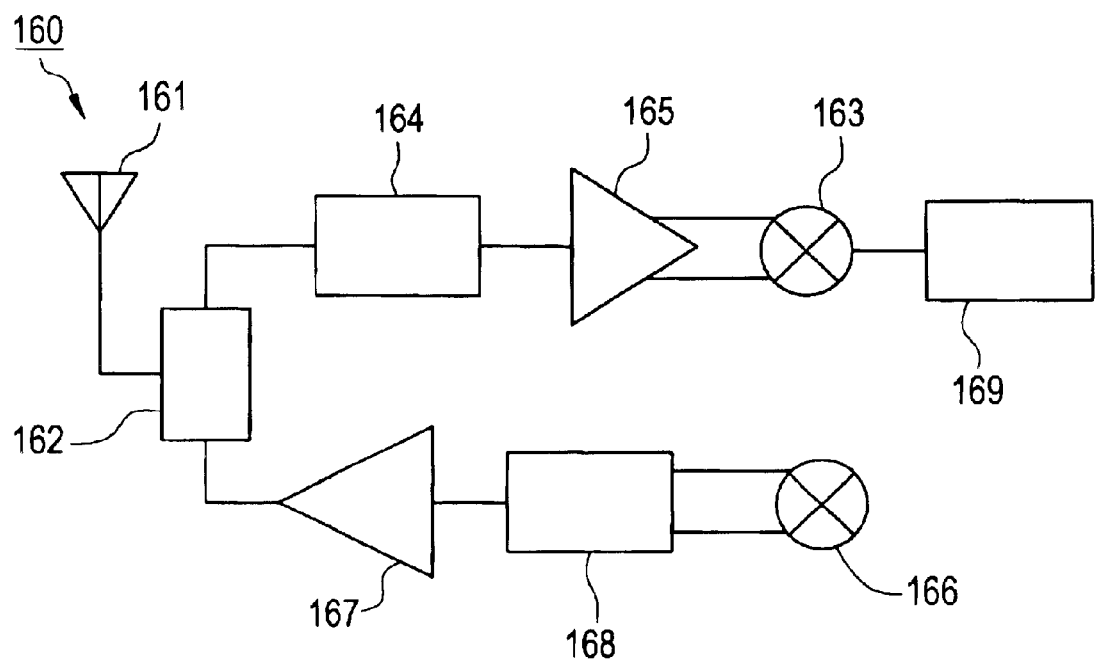
FIG. 28 is a block diagram showing a communication apparatus including a SAW filter device according to preferred embodiments of the present invention.

FIG. 28 is a block diagram showing a communication apparatus 160 in which SAW filter devices according to preferred embodiments of the present invention are preferably included.

Referring to FIG. 28, a duplexer 162 is connected to an antenna 161. A SAW filter 164 and an amplifier 165 which define an RF stage are connected between the duplexer 162 and a receiving mixer 163. A SAW filter 169 at an IF stage is connected to the mixer 163. An amplifier 167 and a SAW filter 168 defining an RF stage are connected between the duplexer 162 and a transmitting mixer 166.

A SAW filter device according to preferred embodiments of the present invention described above is suitable for use as the SAW filter 164 at the RF stage in the communication apparatus 160.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ladder circuit type surface acoustic wave filter device comprising:

a piezoelectric substrate;

a plurality of parallel arm resonators and a plurality of series arm resoriators provided on said piezoelectric substrate, the parallel arm resonators and the series arm resonators being defined by surface acoustic wave resonators; and a plurality of inductors respectively connected in series to said plurality of parallel arm resonators; wherein the parallel arm resonators include at least one first parallel arm resonator of said plurality of parallel arm resonators connected to one of an input end and an output end of the filter device, and a second parallel arm resonator of said plurality of parallel arm resonators connected to a junction between two series arm resonators of said plurality of series arm resonators; and said at least one first parallel arm resonator and said second parallel arm resonator have a relationship represented by the following expression:

$$Cp1 \times 2 < Cp2$$

where Cp1 represents the capacitance of said at least one first parallel arm resonator, and Cp2 represents the capacitance of said second parallel arm resonator; and a total equivalent inductance of all of the inductors of said plurality of inductors that are connected to said second parallel arm resonator is less than a total equivalent inductance of all of the inductors of said plurality of inductors connected to each said at least one first parallel arm resonator.

2. A ladder circuit type surface acoustic wave filter device according to claim 1, further comprising:

a package containing surface acoustic wave elements in which the plurality of parallel arm resonators and the plurality of series arm resonators are provided on said piezoelectric substrate, and a plurality of electrode pads connected to the plurality of series arm resonators or the plurality of parallel arm resonators; and bonding wires for connecting the plurality of electrode pads and the plurality of series arm resonators or the plurality of parallel arm resonators;

wherein the length of one of said plurality of bonding wires connected to said second parallel arm resonator is less than the length of another of said plurality of bonding wires connected to said at least one first parallel arm resonator such that the inductor connected to said second parallel arm resonator has an inductance which is less than the inductance of the inductor connected to said at least one first parallel arm resonator.

3. A communication apparatus comprising at least one ladder circuit type surface acoustic wave filter device according to claim 2, wherein the at least one ladder circuit type surface acoustic wave defines a bandpass filter.

4. A ladder circuit type surface acoustic wave filter device according to claim 1, further comprising:

a package containing surface acoustic wave elements in which the plurality of parallel arm resonators and the plurality of series arm resonators are provided on said piezoelectric substrate, and a plurality of electrode pads connected to the plurality of series arm resonators or the plurality of parallel arm resonators; and bonding wires for connecting the plurality of electrode pads and the plurality of series arm resonators or the plurality of parallel arm resonators;

wherein one end of said second parallel arm resonator is electrically connected to at least two electrode pads among the plurality of electrode pads which are connected to the ground potential such that one of the plurality of inductors which is connected to said second parallel arm resonator has an inductance that is less than the inductance of another of the plurality of inductors connected to said at least one first parallel arm resonator.

5. A communication apparatus comprising at least one ladder circuit type surface acoustic wave filter device according to claim 4, wherein the at least one ladder circuit type surface acoustic wave defines a bandpass filter.

6. A ladder circuit type surface acoustic wave filter device according to claim 1, wherein the capacitance Cp2 of said second parallel arm resonator is within a range represented by the following expression:

$$Cp1 \times 2 < Cp2 < Cp1 \times 10.$$

7. A ladder circuit type surface acoustic wave filter device according to claim 6, wherein the resonance frequency of said second parallel arm resonator is lower than the resonance frequency of each of said at least one first parallel arm resonator.

8. A ladder circuit type surface acoustic wave filter device according to claim 6, further comprising:

a package containing surface acoustic wave elements in which the plurality of parallel arm resonators and the plurality of series arm resonators are provided on said piezoelectric substrate, and a plurality of electrode pads connected to the plurality of series arm resonators or the plurality of parallel arm resonators; and bonding wires for connecting the plurality of electrode pads and the plurality of series arm resonators or the plurality of parallel arm resonators;

wherein the length of one of said plurality of bonding wires connected to said second parallel arm resonator is less than the length of another of said plurality of bonding wires connected to said at least one first parallel arm resonator such that the inductor connected to said second parallel arm resonator has an inductance which is less than the inductance of the inductor connected to said at least one first parallel arm resonator.

9. A ladder circuit type surface acoustic wave filter device according to claim 6, further comprising:

a package containing surface acoustic wave elements in which the plurality of parallel arm resonators and the plurality of series arm resonators are provided on said plezoelectric substrate, and a plurality of electrode pads connected to the plurality of series arm resonators or the plurality of parallel arm resonators; and bonding wires for connecting the plurality of electrode pads and the plurality of series arm resonators or the plurality of parallel arm resonators;

wherein one end of said second parallel arm resonator is electrically connected to at least two electrode pads among the plurality of electrode pads which are connected to the ground potential such that one of the plurality of inductors which is connected to said second parallel arm resonator has an inductance that is less than the inductance of another of the plurality of inductors connected to said at least one first parallel arm resonator.

10. A communication apparatus comprising at least one ladder circuit type surface acoustic wave fitter device according to claim 6, wherein the at least one ladder circuit type surface acoustic wave defines a bandpass filter.

11. A communication apparatus comprising at least one ladder circuit type surface acoustic wave filter device according to claim 1, wherein the at least one ladder circuit type surface acoustic wave defines a bandpass filter.

12. A ladder circuit type surface acoustic wave filter device according to claim 1, wherein the resonance frequency of said second parallel arm resonator is lower than the resonance frequency of each or said at least one first parallel arm resonator.

13. A communication apparatus comprising at least one ladder circuit type surface acoustic wave filter device according to claim 12, wherein the at least one ladder circuit type surface acoustic wave defines a bandpass filter.

14. A ladder circuit type surface acoustic wave filter device according to claim 12, further comprising:

a package containing surface acoustic wave elements in which the plurality of parallel arm resonators and the plurality of series arm resonators are provided on said piezoelectric substrate, and a plurality of electrode pads connected to the plurality of series arm resonators or the plurality of parallel arm resonators; and bonding wires for connecting the plurality of electrode pads and the plurality of series arm resonators or the plurality of parallel arm resonators;

wherein the length of one of the plurality of bonding wires connected to said second parallel arm resonator is less than the length of another of the plurality of bonding wires connected to said at least one first parallel arm resonator such that one of the plurality of inductors connected to said second parallel arm resonator has an inductance which is less than the inductance of another of the plurality of inductors connected to said at least one first parallel arm resonator.

15. A communication apparatus comprising at least one ladder circuit type surface acoustic wave filter device according to claim 14, wherein the at least one ladder circuit type surface acoustic wave defines a bandpass filter.

16. A ladder circuit type surface acoustic wave filter device according to claim 12, further comprising:
- a package containing surface acoustic wave elements in which the parallel arm resonators and the series arm resonators are provided on said piezoelectric substrate, and a plurality of electrode pads connected to the plurality of series arm resonators or the plurality of parallel arm resonators; and
- bonding wires for connecting the plurality of electrode pads and the plurality of series arm resonators or the plurality of parallel arm resonators;
- wherein one end of said second parallel arm resonator is electrically connected to at least two electrode pads among the plurality of electrode pads which are connected to the ground potential such that one of the plurality of inductors which is connected to said second parallel arm resonator has an inductance that is less than the inductance of another of the plurality of inductors connected to said at least one first parallel arm resonator.

17. A communication apparatus comprising at least one ladder circuit type surface acoustic wave filter device according to claim 16, wherein the at least one ladder circuit type surface acoustic wave defines a bandpass filter.

18. A ladder circuit type surface acoustic wave filter device according to claim 1, wherein said at least one first parallel arm resonator includes two first parallel arm resonators.

19. A ladder circuit type surface acoustic wave filter device according to claim 18, wherein said two first parallel arm resonators are disposed at end portions of the surface acoustic wave filter device, and said second parallel arm resonator is disposed between said two first parallel arm resonators.

20. A ladder circuit type surface acoustic wave filter device according to claim 1, wherein the ratio of the capacitance Cp2 of said second parallel arm resonator to the capacitance Cp1 of said first parallel arm resonator is represented by the following expression:

$$Cp2/Cp1=5.$$

* * * * *